(12) United States Patent
Ding et al.

(10) Patent No.: US 9,305,934 B1
(45) Date of Patent: Apr. 5, 2016

(54) VERTICAL NAND DEVICE CONTAINING PERIPHERAL DEVICES ON EPITAXIAL SEMICONDUCTOR PEDESTAL

(71) Applicant: SanDisk Technologies, Inc., Plano, TX (US)

(72) Inventors: Hao Ding, Yokkaichi (JP); Masahiro Yaegashi, Kuwana (JP); Shigehiro Fujino, Yokkaichi (JP); Shuji Minagawa, Yokkaichi (JP); Yuji Fukano, Yokkaichi (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/517,134

(22) Filed: Oct. 17, 2014

(51) Int. Cl.
*H01L 21/00* (2006.01)
*H01L 27/00* (2006.01)
*H01L 27/115* (2006.01)
*H01L 29/423* (2006.01)
*H01L 21/306* (2006.01)
(Continued)

(52) U.S. Cl.
CPC ...... *H01L 27/11573* (2013.01); *H01L 21/0217* (2013.01); *H01L 21/02532* (2013.01); *H01L 21/28282* (2013.01); *H01L 21/30625* (2013.01); *H01L 23/53266* (2013.01); *H01L 27/1157* (2013.01); *H01L 27/11524* (2013.01); *H01L 27/11526* (2013.01); *H01L 27/11556* (2013.01); *H01L 27/11582* (2013.01); *H01L 29/42376* (2013.01)

(58) Field of Classification Search
CPC ..................... H01L 21/0217; H01L 21/28282; H01L 21/30625; H01L 21/02532; H01L 23/53266; H01L 23/18; H01L 23/49848; H01L 27/11573; H01L 27/11524; H01L 27/11582; H01L 27/11526; H01L 27/11556; H01L 27/1157; H01L 27/10808; H01L 27/0688; H01L 27/11; H01L 29/42376; H01L 29/423; H01L 29/78642; H01L 29/78687

See application file for complete search history.

(56) References Cited

U.S. PATENT DOCUMENTS 5,915,167 A  6/1999  Leedy
7,005,350 B2  2/2006  Walker et al.
(Continued)

FOREIGN PATENT DOCUMENTS

WO  WO 02/15277 A2  2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Nikolay Yushin
(74) *Attorney, Agent, or Firm* — The Marbury Law Group PLLC

(57) ABSTRACT

A multilevel structure includes a stack of an alternating plurality of electrically conductive layers and insulator layers located over a semiconductor substrate, and an array of memory stack structures located within memory openings through the stack. An epitaxial semiconductor pedestal is provided, which is in epitaxial alignment with a single crystalline substrate semiconductor material in the semiconductor substrate and has a top surface within a horizontal plane located above a plurality of electrically conductive layers within the stack. The contact via structures for the semiconductor devices on the epitaxial semiconductor pedestal can extend can be less than the thickness of the stack.

32 Claims, 25 Drawing Sheets

(51) Int. Cl.
  *H01L 21/02* (2006.01)
  *H01L 21/28* (2006.01)
  *H01L 23/532* (2006.01)

(56) References Cited

U.S. PATENT DOCUMENTS

| | | | |
|---|---|---|---|
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,696,559 | B2 | 4/2010 | Arai et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,394,716 | B2 | 3/2013 | Hwang et al. |
| 2007/0210338 | A1 | 9/2007 | Orlowski |
| 2007/0252201 | A1 | 11/2007 | Kito et al. |
| 2009/0230449 | A1 | 9/2009 | Sakaguchi et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2012/0119287 | A1 | 5/2012 | Park et al. |
| 2013/0264631 | A1 | 10/2013 | Alsmeier et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

VERTICAL NAND DEVICE CONTAINING PERIPHERAL DEVICES ON EPITAXIAL SEMICONDUCTOR PEDESTAL

FIELD

The present disclosure relates generally to the field of three-dimensional devices, and specifically to three-dimensional memory devices incorporating peripheral transistors, and methods of manufacturing the same.

BACKGROUND

Peripheral devices are needed to control operation of various memory elements in three-dimensional memory devices. As the number of stacks in three-dimensional memory devices increase, the height of contact via structures for providing electrical contact to peripheral devices increases. Such an increase in the height of contact via structures makes it difficult to form reliable contact via structures for the peripheral devices.

SUMMARY

According to an aspect of the present disclosure, a multilevel structure is provided, which comprises a stack of an alternating plurality of electrically conductive layers and insulator layers located over a semiconductor substrate, an array of memory stack structures located within memory openings through the stack, and an epitaxial semiconductor pedestal in epitaxial alignment with a single crystalline substrate semiconductor material in the semiconductor substrate and having a top surface within a horizontal plane located above a plurality of electrically conductive layers within the stack.

According to another aspect of the present disclosure, a method of fabricating a multilevel structure is provided. A stack including an alternating plurality of material layers and insulator layers is formed over a semiconductor substrate. An opening is formed through the stack. A top surface of the semiconductor substrate is exposed at a bottom of the opening. Within the opening, an epitaxial semiconductor pedestal is formed in epitaxial alignment with a single crystalline substrate semiconductor material in the semiconductor substrate. An array of memory openings is formed through the stack after formation of the epitaxial semiconductor pedestal. An array of memory stack structures is formed within the array of memory openings.

DETAILED DESCRIPTION

As discussed above, the present disclosure is directed to three-dimensional memory devices incorporating peripheral transistors, and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Figures 1A, 1B:
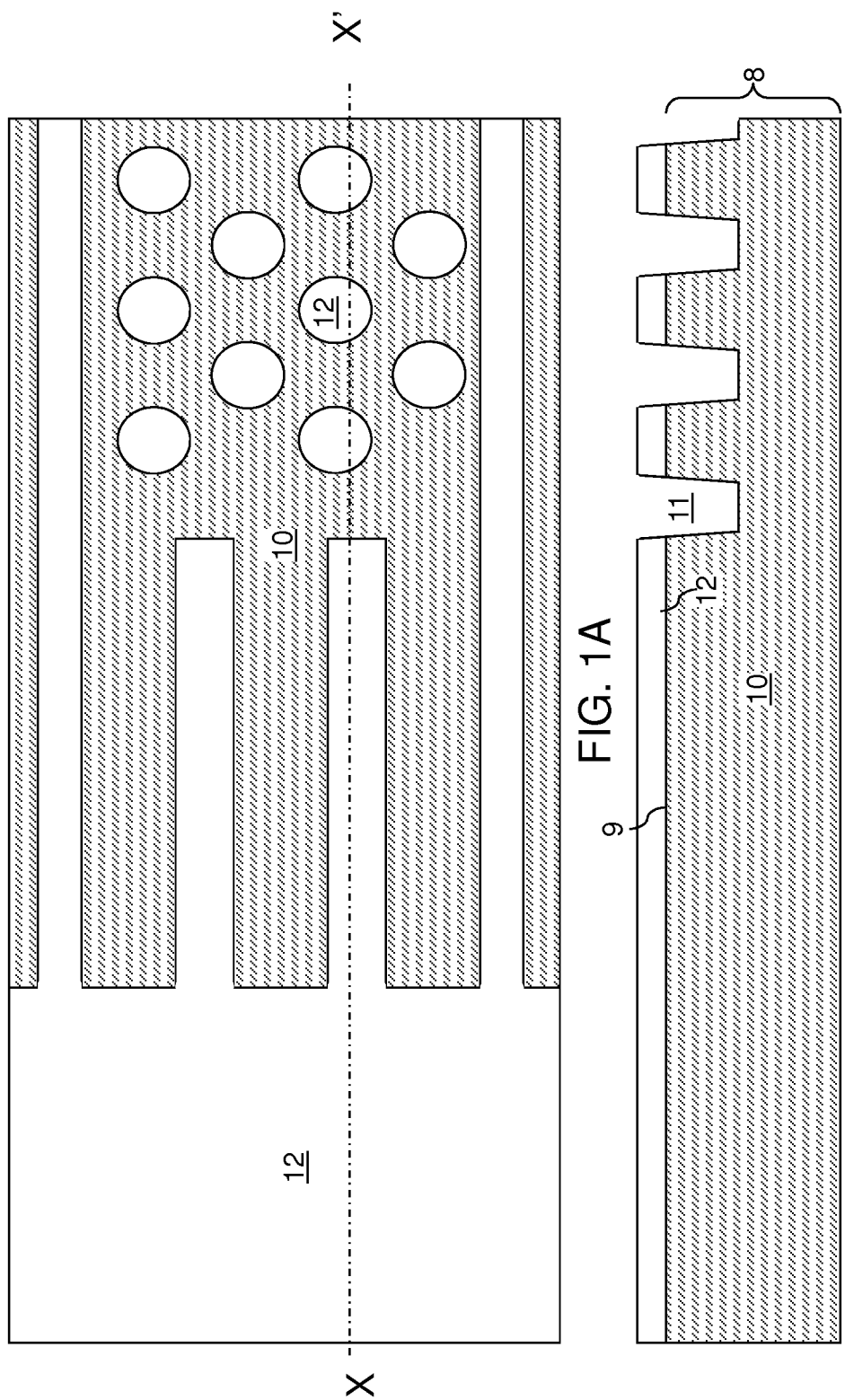
FIG. 1A is a top-down view of the exemplary structure of FIG. 1B.
FIG. 1B is a vertical cross-sectional view along line X-X' in FIG. 1A of an exemplary structure after formation of shallow trenches in a substrate according to an embodiment of the present disclosure.

Referring to FIGS. 1A and 1B, an exemplary structure according to an embodiment of the present disclosure is illustrated, which can be employed, for example, to fabricate a device structure containing vertical NAND memory devices. The exemplary structure includes a substrate 8, which can be a semiconductor substrate. The substrate 8 can include a substrate semiconductor layer 10. The substrate semiconductor layer 10 is a semiconductor material layer, and can include at least one elemental semiconductor material, at least one III-V compound semiconductor material, at least one II-VI compound semiconductor material, at least one organic semiconductor material, or other semiconductor materials known in the art. The substrate 8 can have a major surface 9, which can be, for example, a topmost surface of the substrate semiconductor layer 10. The major surface 9 can be a semiconductor surface. In one embodiment, the major surface 9 can be a single crystalline semiconductor surface.

As used herein, a "semiconductor material" refers to a material having electrical conductivity in the range from $1.0 \times 10^{-5}$ Ohm-cm to $1.0 \times 10^{5}$ Ohm-cm, and is capable of producing a doped material having electrical conductivity in a range from 1 Ohm-cm to $1.0 \times 10^{5}$ Ohm-cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than 1.0 Ohm-cm. As used herein, an "insulator material" or a "dielectric material" refers to a material having electrical conductivity less than $1.0 \times 10^{-5}$ Ohm-cm. All measurements for electrical conductivities are made at the standard condition. Optionally, at least one doped well (not expressly shown) can be formed within the substrate semiconductor layer 10.

Optionally, a dielectric pad layer 12 can be formed an a top surface of the substrate semiconductor layer 10. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench 11 can be formed through the dielectric pad layer 12 and an upper portion of the substrate semiconductor layer 10. The pattern of the at least one shallow trench 11 can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

Figure 2:
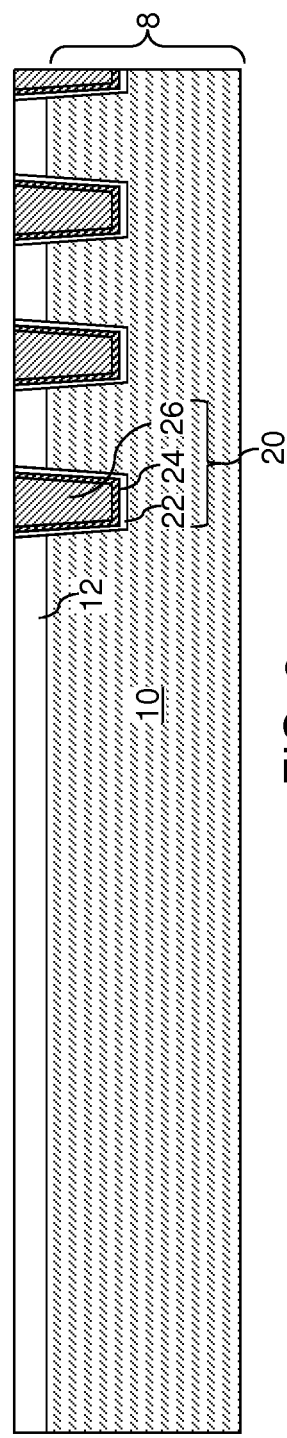
FIG. 2 is a vertical cross-sectional view of the exemplary structure after formation of lower select gate structures according to an embodiment of the present disclosure.

Referring to FIG. 2, a lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate 8.

Figure 3:
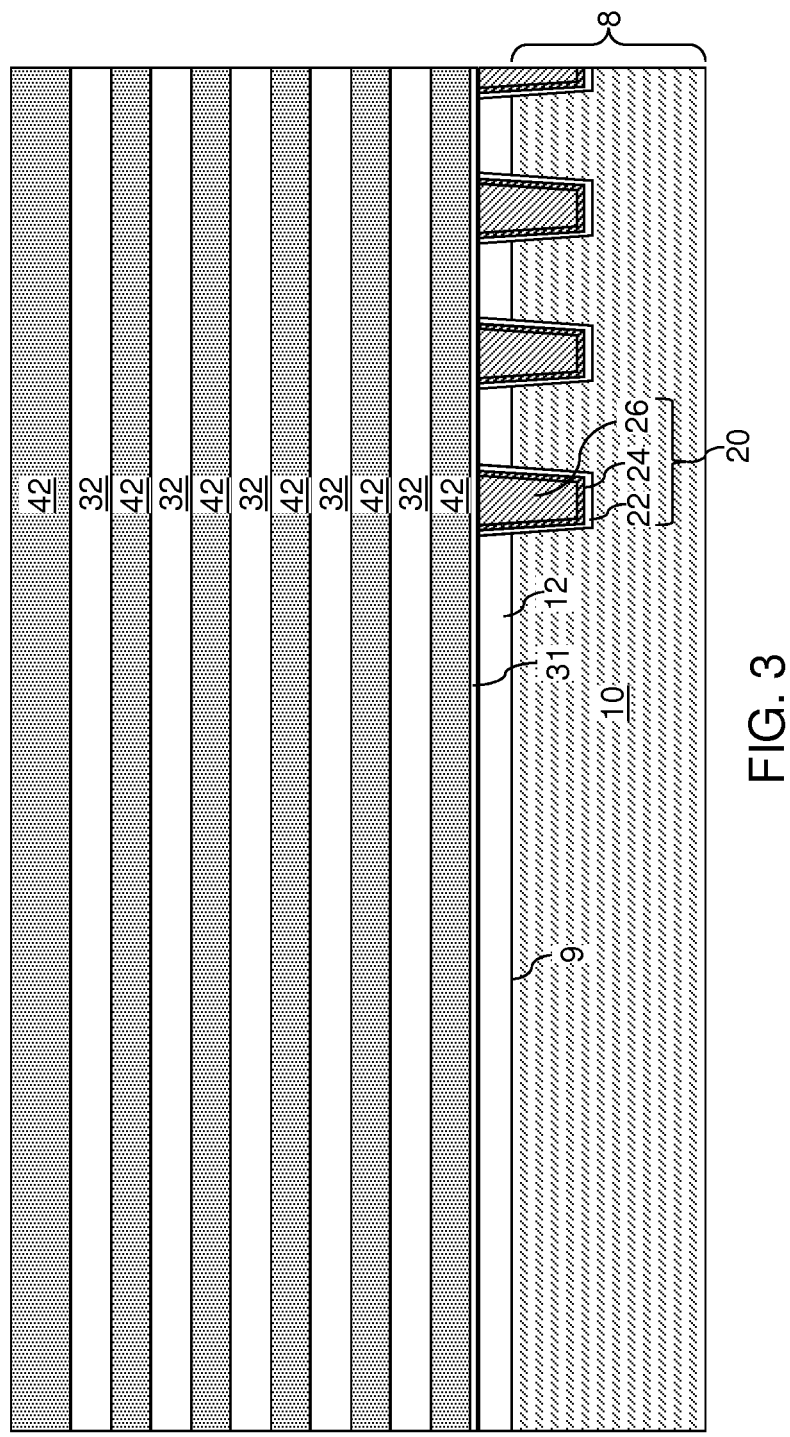
FIG. 3 is a vertical cross-sectional view of the exemplary structure after formation of a stack of an alternating plurality of sacrificial material layers and insulator layers according to an embodiment of the present disclosure.

Referring to FIG. 3, a dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers 42 to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate 8, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 9 of the substrate 8.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Figure 4:
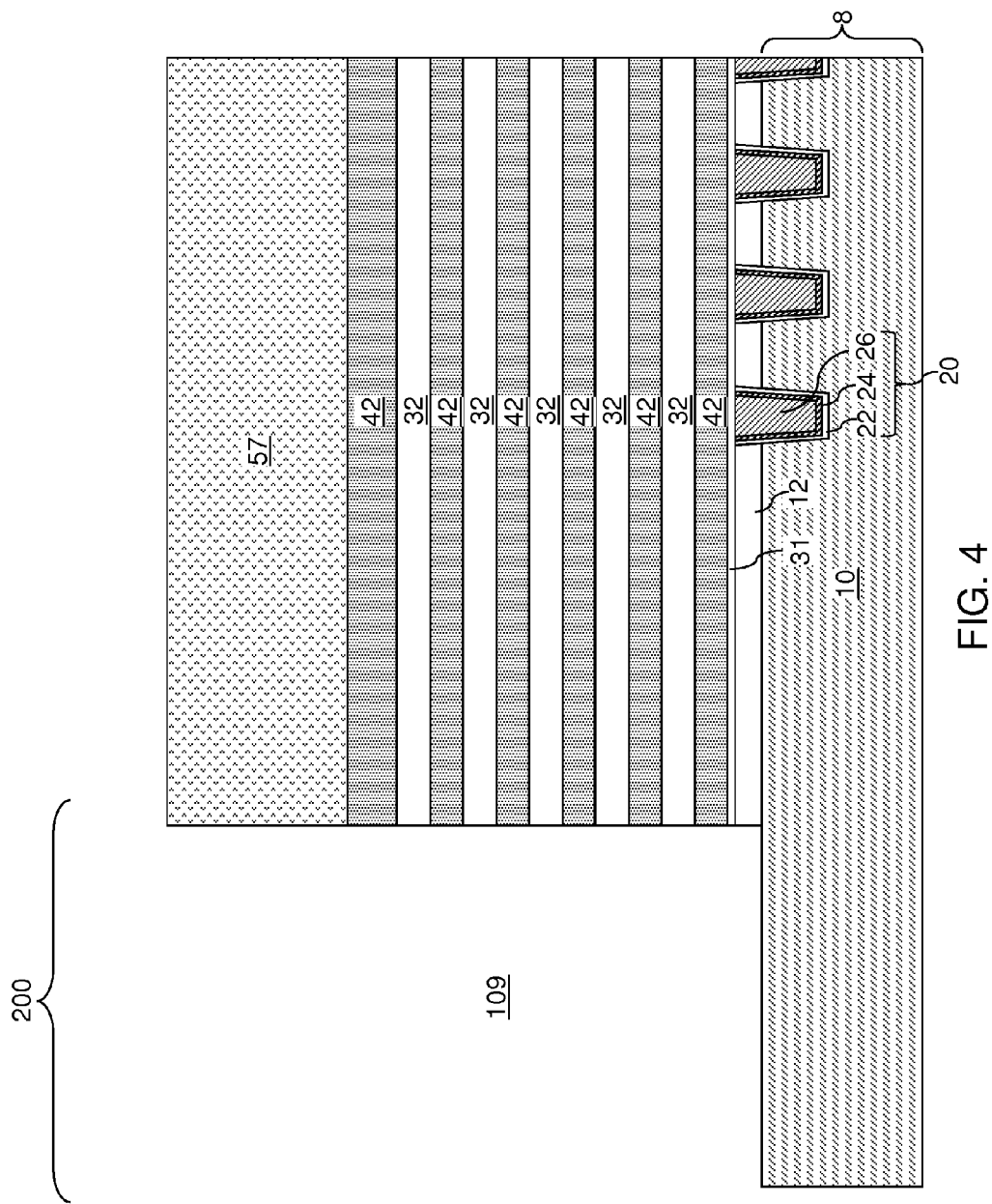
FIG. 4 is a vertical cross-sectional view of the exemplary structure after removing the stack of the alternating plurality of material layers from a peripheral device region according to an embodiment of the present disclosure.

Referring to FIG. 4, a mask, such as a photoresist layer 57 is applied over the alternating stack (32, 42), and is lithographically patterned to form an opening 109 which is then extended through the alternating stack (32, 42) such that it extends to the top surface of the substrate semiconductor layer 10. Peripheral devices for operation of memory devices can be subsequently formed within the region of the opening 109, and thus, the region of the opening 109 is herein referred to as a peripheral device region 200. A top surface of the substrate semiconductor layer 10 is physically exposed at the bottom of the opening 109. The photoresist layer 57 can be subsequently removed selective to the alternating stack (32, 42) and the substrate semiconductor layer 10, for example, by ashing.

Figure 5:
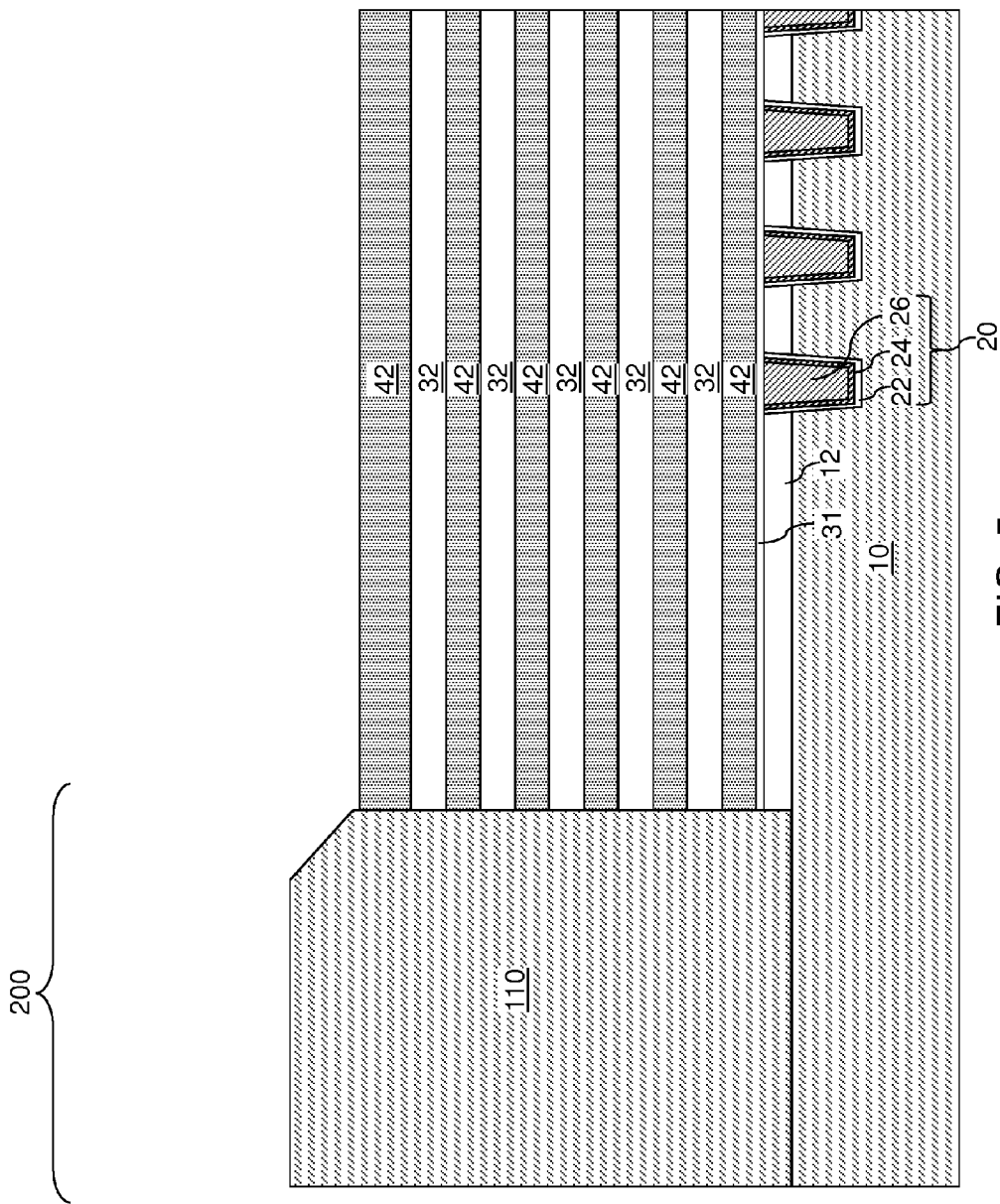
FIG. 5 is a vertical cross-sectional view of the exemplary structure after formation of an epitaxial semiconductor pedestal according to an embodiment of the present disclosure.

Referring to FIG. 5, a selective epitaxy process can be performed to deposit a single crystalline semiconductor material within the opening 109. During a selective epitaxy process, a reactant that is a precursor for a semiconductor material and an etchant that etches the semiconductor material are simultaneously or alternately flowed into a process chamber including the exemplary structure. The process conditions are selected such that the deposition rate of the semiconductor material derived from the precursor on a single crystalline semiconductor surface is greater than the etch rate, and the deposition rate of the semiconductor material on an amorphous surface (or a polycrystalline surface) is less than the etch rate. The surfaces of the insulator layers 32 and the sacrificial material layers 42 can be amorphous or polycrystalline, and the physically exposed surface of the substrate semiconductor layer 10 can be single crystalline. In this case, the semiconductor material derived from the precursor can be deposited as a single crystalline semiconductor material portion in epitaxial alignment with the single crystalline structure of the substrate semiconductor layer 10.

The single crystalline semiconductor material deposited in the opening 109 is herein referred to as an epitaxial semiconductor pedestal 110, which can grow at least to the horizontal plane including the topmost surface of the alternating stack (32, 42). The epitaxial semiconductor pedestal 110 is in epitaxial alignment with a single crystalline substrate semiconductor material of the substrate semiconductor layer 10, which is located in the semiconductor substrate.

Figure 6:
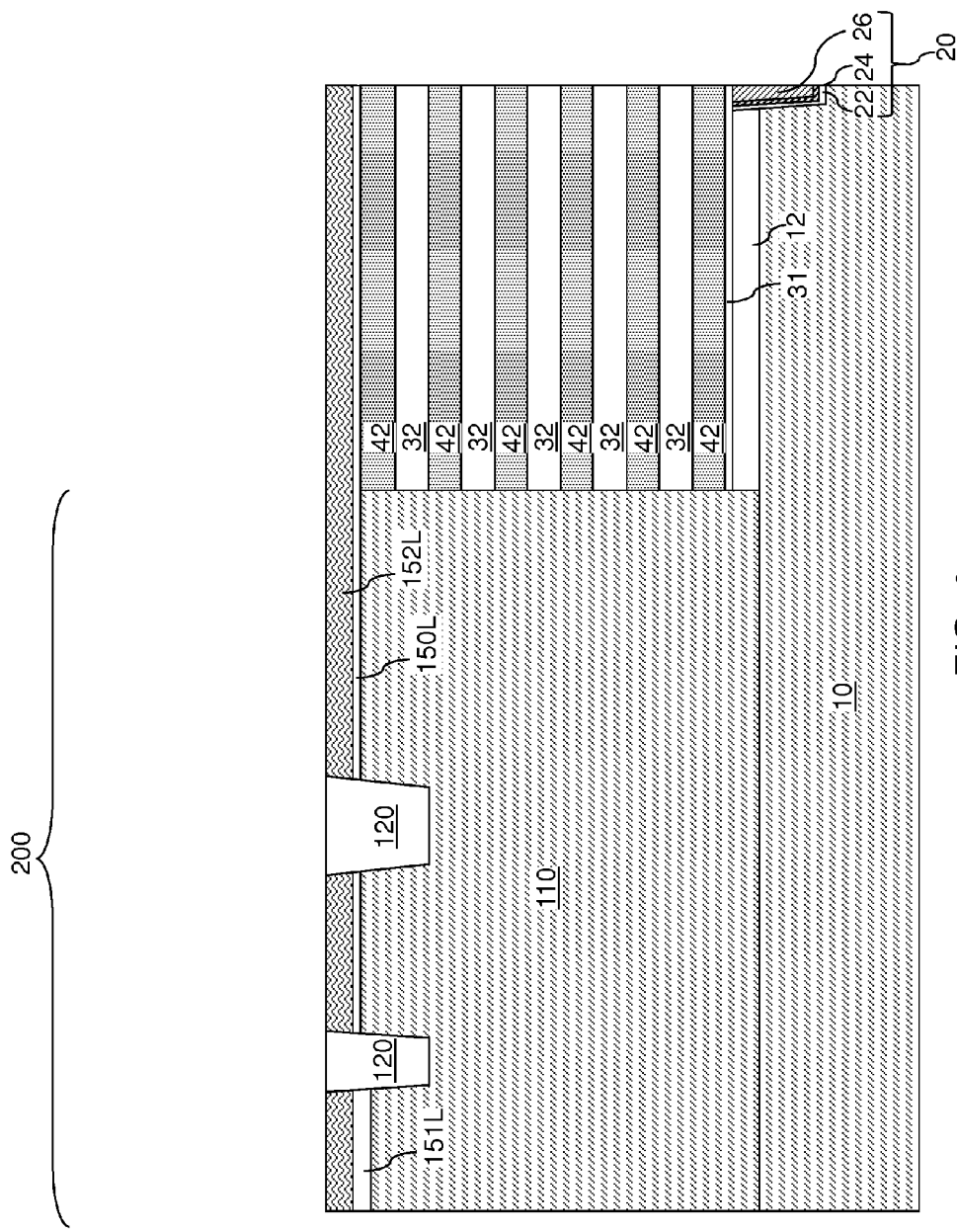
FIG. 6 is a vertical cross-sectional view of the exemplary structure after formation of a gate dielectric layer and a first gate conductor layer according to an embodiment of the present disclosure.

Referring to FIG. 6, the top surface of the deposited single crystalline semiconductor material, i.e., the top surface of the epitaxial semiconductor pedestal 110, can be recessed to a height that is not lower than the topmost surface of the alternating stack (32, 42). In one embodiment, the recessing of the top surface of the deposited single crystalline semiconductor material can be performed by chemical mechanical planarization (CMP). In one embodiment, the topmost surface of the stack can be employed as a stopping layer during planarization of the top surface of the deposited single crystalline semiconductor material. Subsequently, peripheral semiconductor devices (e.g., driver circuit devices), which can be employed to control the operation of memory stack structures to be subsequently formed, can be formed in the peripheral device region 200. The peripheral semiconductor devices can include, for example a CMOS device containing complementary field effect transistors. For example, a gate dielectric layer 150L and a first gate conductor layer 152L can be formed over the epitaxial semiconductor pedestal 110 and the alternating stack (32, 42). The gate dielectric layer 150L can include silicon oxide and/or silicon nitride, and/or a dielectric metal oxide. The first gate conductor layer 152L can include a doped semiconductor material or an electrically conductive (e.g., metallic) material. Shallow trench isolation structures 120 can be formed, for example, by forming shallow trenches in various upper portions of the epitaxial semiconductor pedestal 110, and by filling the shallow trenches with a dielectric material such as silicon oxide.

Figure 7:
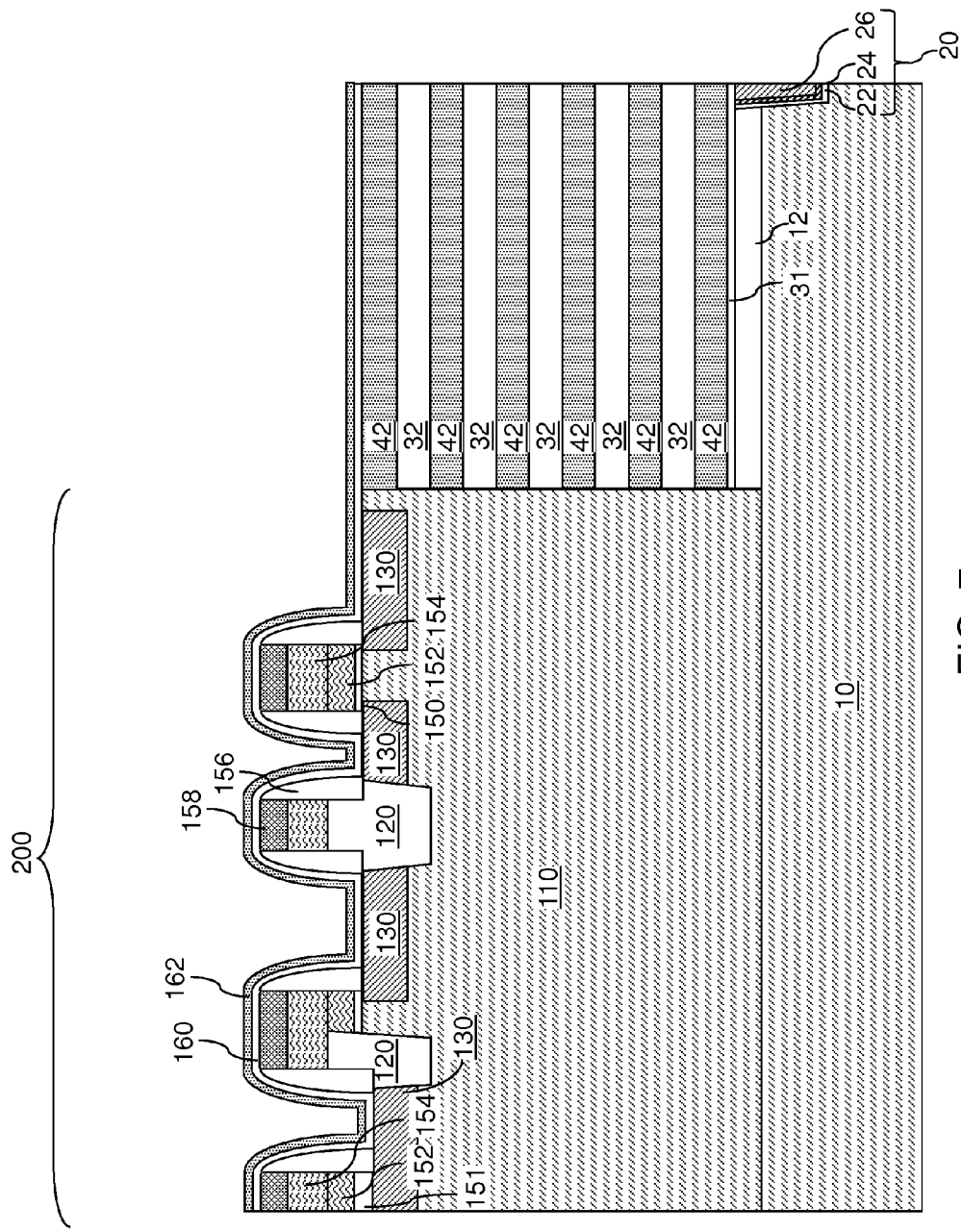
FIG. 7 is a vertical cross-sectional view of the exemplary structure after formation of field effect transistor in the peripheral device region according to an embodiment of the present disclosure.

Referring to FIG. 7, at least one semiconductor device can be formed on a top surface of the epitaxial semiconductor pedestal 110, which is present in the peripheral device region 200. The at least one semiconductor device can include, for example, field effect transistors. In a non-limiting illustrative example, a second gate conductor layer and a gate cap dielectric layer can be formed over the first gate conductor layer 152L. The gate cap dielectric layer, the second gate conductor layer, the first gate conductor layer, and the shallow trench isolation structures 120 can be patterned, for example, by a combination of lithographic methods and anisotropic etching.

Active regions 130 can be formed in upper portions of the epitaxial semiconductor pedestal 110, for example, by introducing electrical dopants employing the patterned portions of the gate cap dielectric layer, the second gate conductor layer, the first gate conductor layer, and the shallow trench isolation structures 120 as masking structures. Additional masks may be employed as needed. The active region 130 can include source regions and drain regions of field effect transistors. Remaining portions of the gate dielectric layer 150L constitute gate dielectrics 150, remaining portions of the first gate conductor layer constitute first gate electrode portions 152, remaining portions of the second gate conductor layer constitute second gate electrode portions 154, and remaining portions of the gate cap dielectric layer constitute gate cap dielectrics 158. A first gate electrode portion 152 and/or a second gate electrode portion 154 can constitute the gate electrode of a field effect transistor that protrudes above a horizontal plane including the topmost surface of the alternating stack (32, 42). Insulating sidewall spacers 156 can be optionally formed on the gate sidewalls as needed. A first dielectric liner 160 and a second dielectric liner 162 can be optionally formed. Each of the first and second dielectric liners (160, 162) can comprise a silicon oxide layer, a silicon nitride layer, and/or a dielectric metal oxide layer. In an illustrative example, the first dielectric liner 160 can be a silicon oxide layer, and the second dielectric liner 162 can be a silicon nitride layer.

Figure 8:
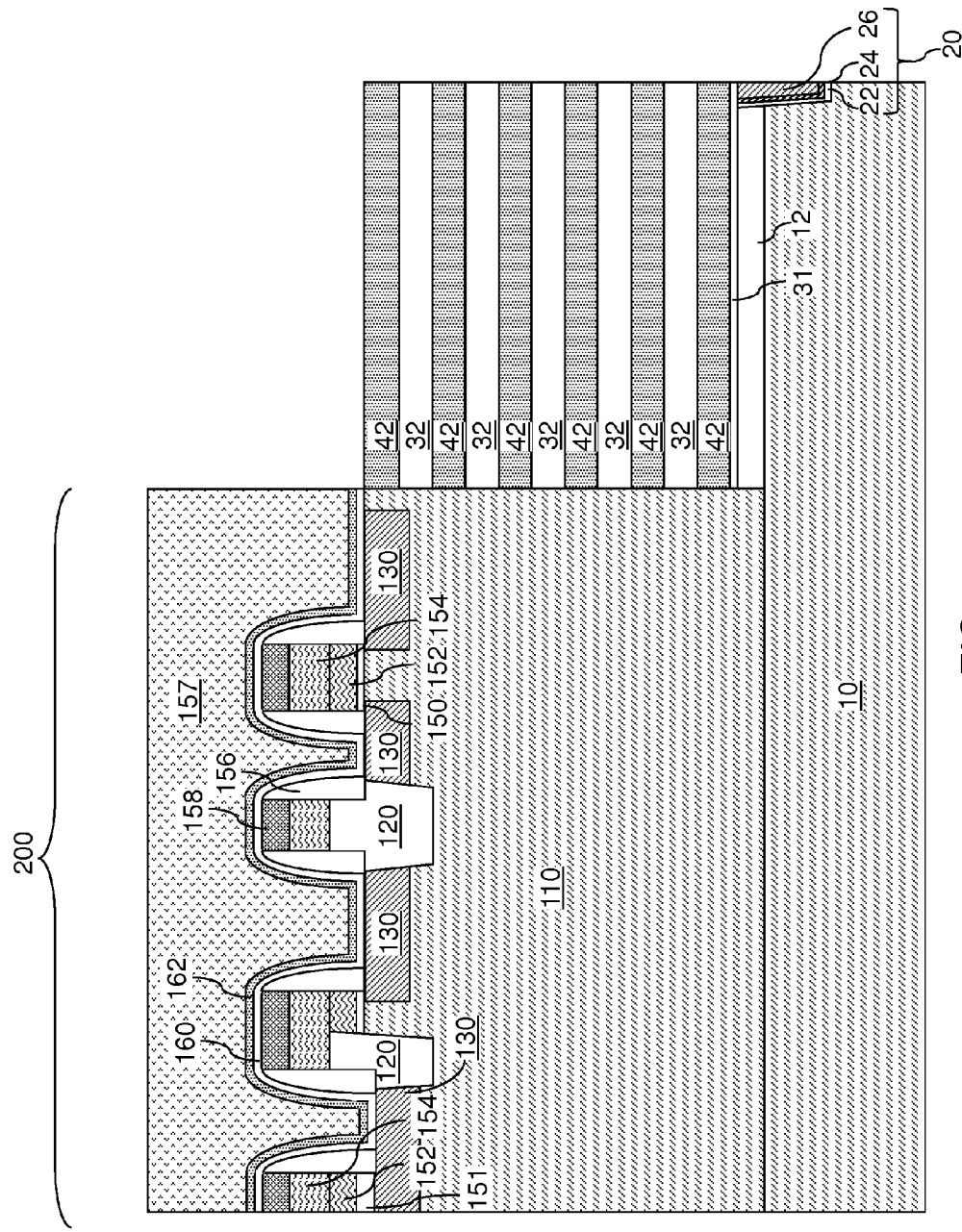
FIG. 8 is a vertical cross-sectional view of the exemplary structure after removal of dielectric liners outside of the peripheral device region according to an embodiment of the present disclosure.

Referring to FIG. 8, a photoresist layer 157 can be optionally applied over the exemplary structure, and can be lithographically patterned to form openings in the area of the alternating stack (32, 42). In this case, physically exposed portions of the first and second dielectric liners (160, 162) can be removed by an etch. The etch process that removes the first dielectric liner 160 can have an etch chemistry that is selective to the material of the topmost layer within the alternating stack (32, 42). The photoresist layer 157 can be subsequently removed, for example, by ashing.

Figure 9:
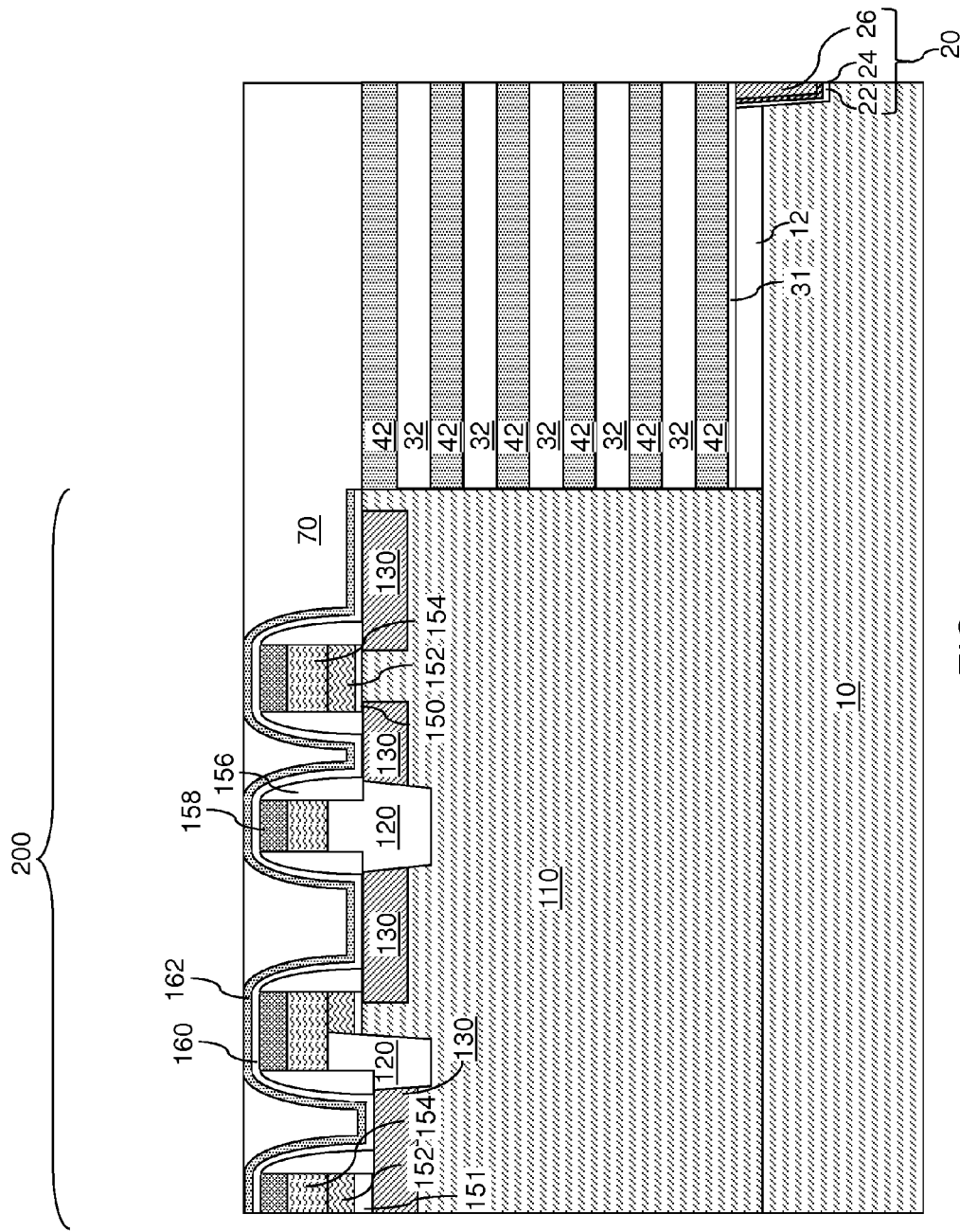
FIG. 9 is a vertical cross-sectional view of the exemplary structure after deposition and planarization of a planarization dielectric layer according to an embodiment of the present disclosure.

Referring to FIG. 9, a planarization dielectric layer 70 can be deposited over the alternating stack (32, 42) and the first and second dielectric liners (160, 162), and planarized to provide a planar top surface. The dielectric material of the planarization dielectric layer 70 can be, for example, silicon oxide or any other dielectric material that can be planarized. The dielectric material of the planarization dielectric layer 70 can be planarized employing the topmost portions of the second and/or first dielectric liners (160, 162) as a stopping layer. In one embodiment, the topmost surface of the first and second dielectric liners (160, 162) can be coplanar with the top surface of the planarization dielectric layer 70 after the planarization process. Optionally, additional dielectric material layers (not shown) can further be formed as needed.

Figure 10:
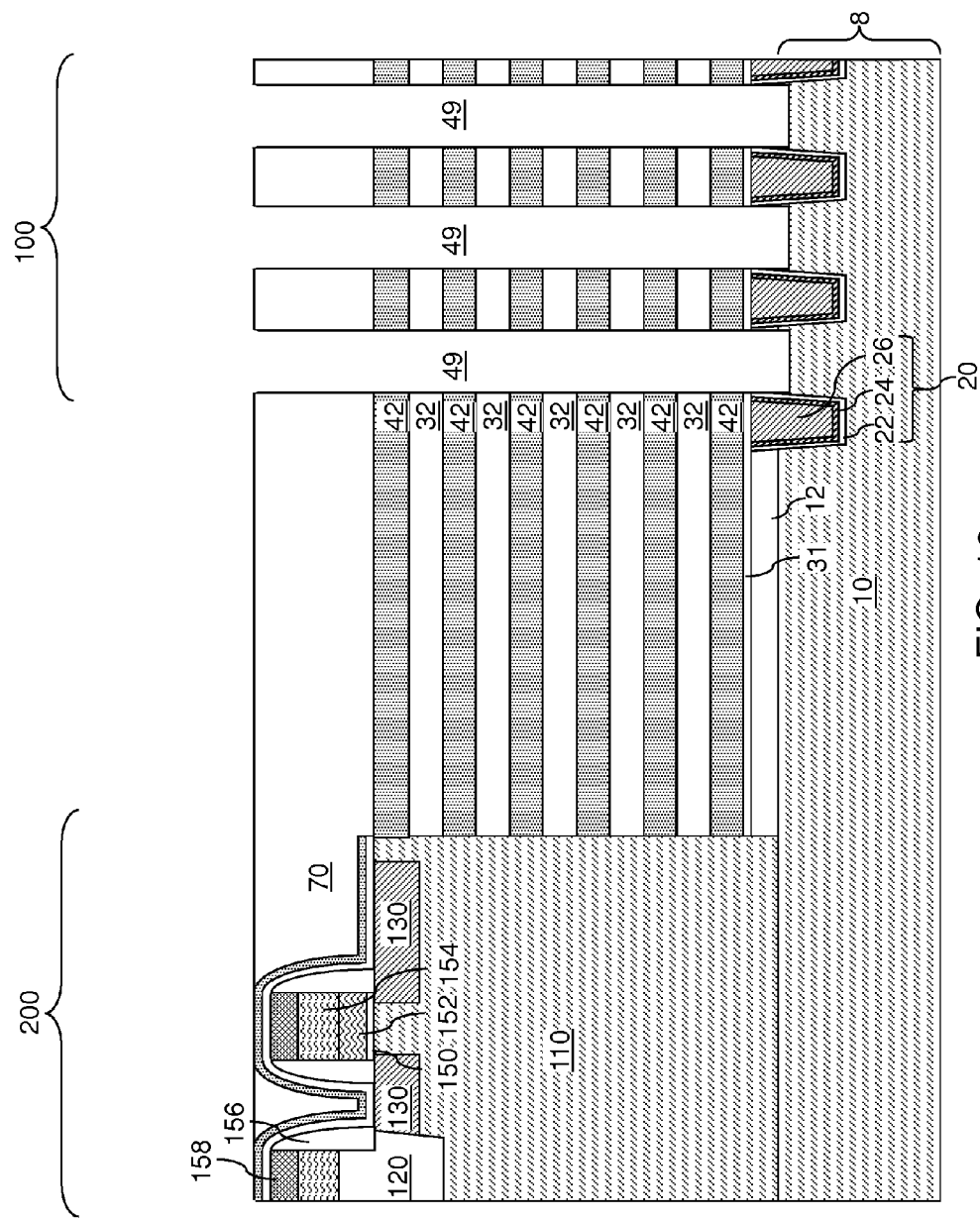
FIG. 10 is a vertical cross-sectional view of the exemplary structure after formation of memory openings according to an embodiment of the present disclosure.

Referring to FIG. 10, a lithographic material stack (not shown) including at least a photoresist layer can be formed over the alternating stack (32, 42), and can be lithographically patterned to form openings therein. The pattern in the lithographic material stack can be transferred through the entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate 8. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the substrate semiconductor layer 10 within the substrate 9 between the lower select gate electrodes (24, 26). In one embodiment, an overetch into the substrate semiconductor layer 10 can be optionally performed after the top surface of the substrate semiconductor layer 10 is physically exposed at a bottom of each memory opening 49. The overetch may be performed prior to, or after, removal of the lithographic material stack. In other words, the recessed surfaces of the substrate semiconductor layer 10 can be vertically offset from the undressed top surfaces of the substrate semiconductor layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the substrate semiconductor layer 10. Each of the memory openings 49 can include a sidewall (or a plurality of sidewalls) that extends substantially perpendicular to the topmost surface of the substrate 8. The array of memory openings 49 can be formed through the alternating stack (32, 42) after formation of the epitaxial semiconductor pedestal 110. The region in which the array of memory openings 49 is formed is herein referred to as a device region 100.

Figure 11:
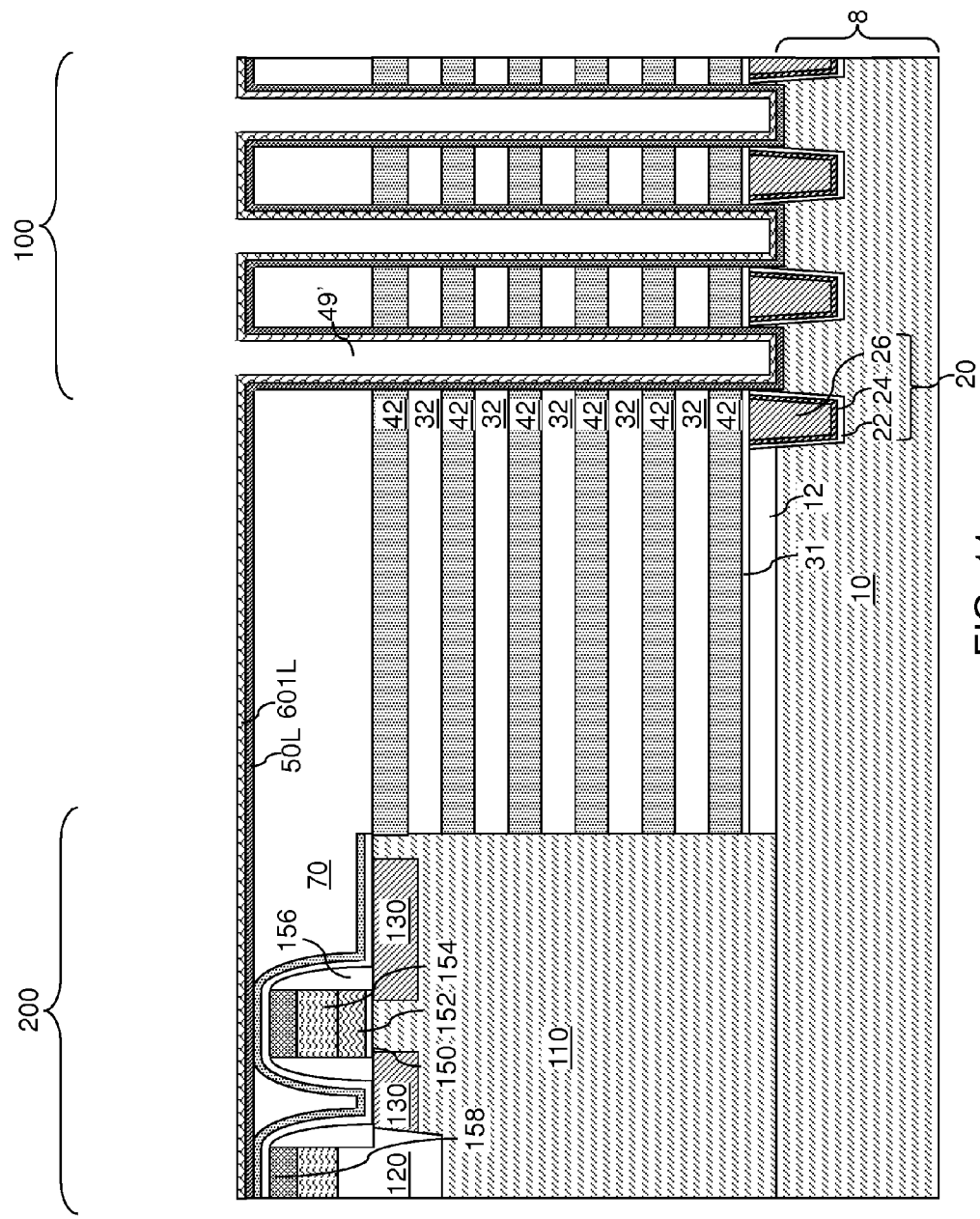
FIG. 11 is a vertical cross-sectional view of the exemplary structure after formation of a memory film layer and at least one semiconductor channel layer according to an embodiment of the present disclosure.

Referring to FIG. 11, a memory film layer 50L can be formed in the memory openings 49 and over the alternating stack (32, 42). The memory film layer 50L can be a stack of contiguous material layers that are sequentially formed within the memory openings 49 and over the alternating stack (31, 42,). The memory film layer 50L contacts all sidewall surface(s) and all bottom surface(s) of the memory openings 49. The memory film layer 50L is a contiguous film stack that provides the functionality of charge storage in the absence of an external electrical bias voltage, while enabling charge transfer in the presence of a suitable external electrical bias voltage.

In one embodiment, the memory film layer 50L can be a stack, in the order of formation, of a blocking dielectric layer, at least one charge storage element, and a tunneling dielectric layer. In one embodiment, the at least one charge storage element can be a plurality of floating gates or a charge trapping layer, and can be located between the tunneling dielectric layer and the blocking dielectric layer.

The blocking dielectric layer contacts the sidewalls of the memory openings. Specifically, the blocking dielectric layer can contact the sidewalls of the sacrificial material layers 42. The blocking dielectric layer may include one or more dielectric material layers that can function as the dielectric material(s) of a control gate dielectric between the sacrificial material layers 42 and charge storage regions to be subsequently formed out of the charge storage layer. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed through the backside contact trench in recesses formed by removal of the sacrificial material layers 42 prior to forming conductive control gate electrodes through a backside contact trench.

In one embodiment, the at least one charge storage element can be a charge trapping layer that includes a dielectric charge trapping material, which can be, for example, silicon nitride, or a conductive material such as doped polysilicon or a metallic material. In one embodiment, the charge trapping layer includes silicon nitride. The charge trapping layer can be formed as a single charge trapping layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge trapping layer may comprise an insulating charge trapping material, such as one or more silicon nitride segments. Alternatively, the charge trapping layer may comprise conductive nanoparticles such as metal nanoparticles, which can be, for example, ruthenium nanoparticles. The charge trapping layer can be formed, for example, by chemical vapor deposition (CVD), atomic layer deposition (ALD), physical vapor deposition (PVD), or any suitable deposition technique for the selected material(s) for the charge trapping layer. The thickness of the charge trapping layer can be in a range from 2 nm to 20 nm, although lesser and greater thicknesses can also be employed.

The tunneling dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunneling dielectric layer can be in a range from 2 nm to 20 nm, although lesser and greater thicknesses can also be employed.

Subsequently, a first semiconductor channel layer 601L can be deposited directly on the surfaces of the memory film layer 50L by a conformal deposition method such as chemical vapor deposition (CVD). The first semiconductor channel layer 601L includes an amorphous or polycrystalline semiconductor material such as polysilicon. The first semiconductor channel layer 60L may, or may not, be doped with electrical dopants such as p-type dopant or n-type dopants.

Figure 12:
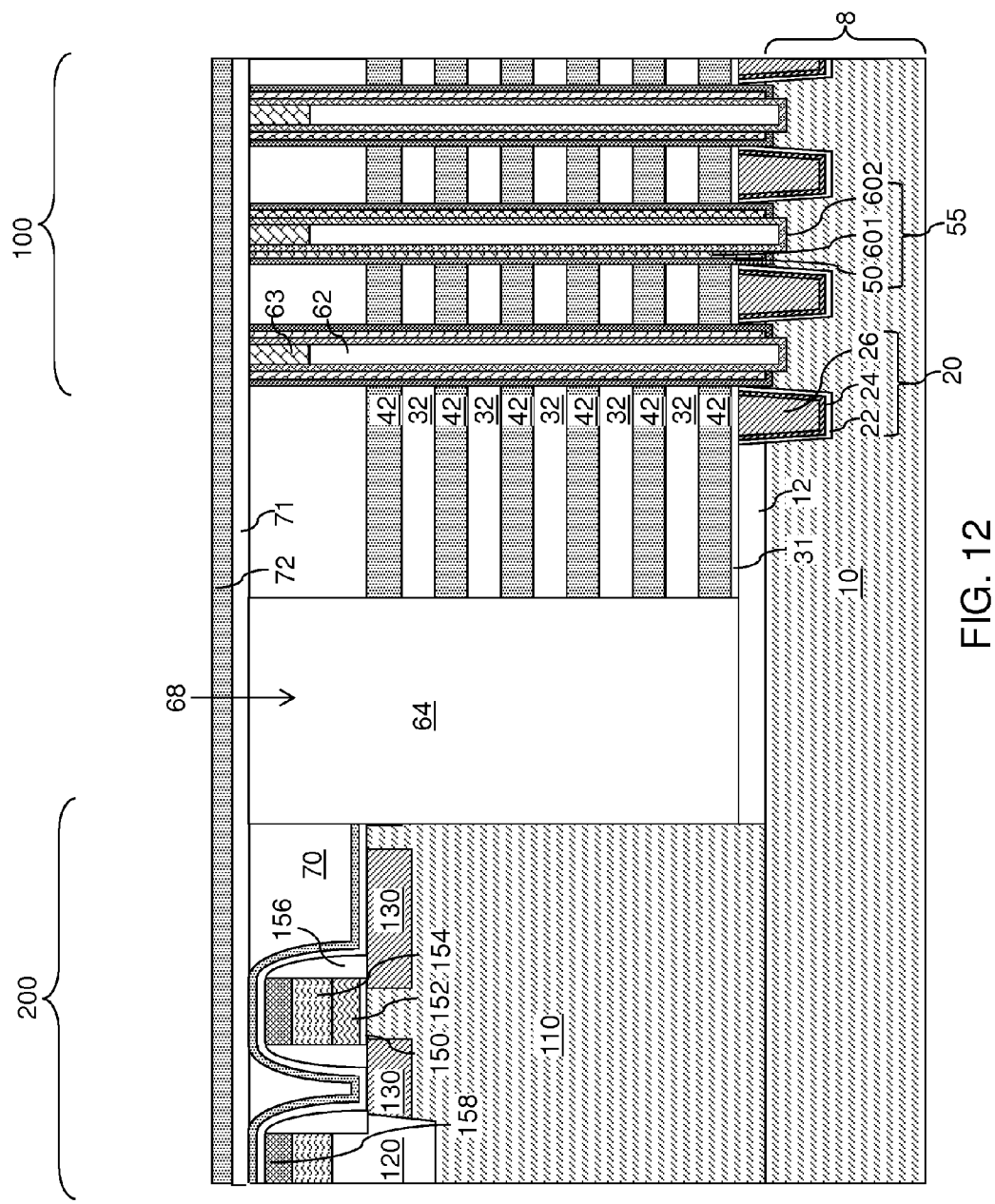
FIG. 12 is a vertical cross-sectional view of the exemplary structure after formation of memory stack structures and optional dielectric cap layers according to an embodiment of the present disclosure.

Referring to FIG. 12, the first semiconductor channel layer 601L and the memory film layer 50L can be anisotropically etched to remove the horizontal portions thereof. An opening is formed through the bottommost portions of the first semiconductor channel layer 601L and the memory film layer 50L. Optionally, an overetch may be performed into the substrate semiconductor layer 10 after formation of openings through the first semiconductor channel layer 601L and the memory film layer 50L. A top surface of the substrate semiconductor layer 10 is physically exposed at the bottom of each memory opening. Each remaining vertical portion of the memory film layer 50L within a memory opening constitutes a memory film 50. Each remaining portion of the first semiconductor channel layer 601L within a memory opening constitutes a first semiconductor channel portion 601.

A second semiconductor channel layer 602 can be deposited on the sidewalls of the first semiconductor channel portions 601, physically exposed surfaces of the substrate semiconductor layer 10 within the memory openings, and over the planarization dielectric layer 70. The semiconductor material of the second semiconductor channel layer can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

Optionally, a dielectric material can be deposited within the cavities in the memory openings. The deposited dielectric material can include, for example, doped silicon oxide such as borosilicate glass (BSG), phosphosilicate glass (PSG), fluorosilicate glass (FSG), or borophosphosilicate glass (BPSG). The portions of the deposited dielectric material and the second semiconductor channel layer above the horizontal plane including the top surface of the planarization dielectric layer 70 can be removed, for example, by chemical mechanical planarization. Each remaining portion of the second semiconductor channel layer within a memory opening constitutes a second semiconductor channel portion 602. Each combination of a first semiconductor channel portion 601 and a second semiconductor channel portion 602 within a same memory opening constitutes a semiconductor channel (601, 602). Subsequently, the remaining portions of the deposited dielectric material can be recessed below the horizontal plane including the top surface of the planarization dielectric layer 70 by an etch, which can be an anisotropic etch. Each remaining portion of the recessed dielectric material within a memory opening constitutes a dielectric core 62. The dielectric core 62 is an optional component, and a combination of a memory film 50 and a semiconductor channel (601, 602) may completely fill a memory opening.

Drain regions 63 can be formed by recessing a top portion of each dielectric core 62 and by depositing a doped semiconductor material. The doped semiconductor material can be, for example, doped polysilicon. Excess portions of the deposited semiconductor material can be removed from above the top surface of the alternating stack (32, 42), for example, by chemical mechanical planarization (CMP) or a recess etch.

In one embodiment, each memory film 50 can include a charge trapping layer, and each semiconductor channel (601, 602) can include a portion that extends vertically from the top surface of the semiconductor substrate, i.e., from the top surface of the substrate semiconductor layer 10, to the top surface of the alternating stack (32, 42).

A set of a memory film 50 and a semiconductor channel (601, 602) can constitute a memory stack structure 55, which includes a stack of multiple memory elements in which information can be stored as presence or absence of electrical charges. An array of memory stack structures 55 can be formed within an array of respective memory openings. An array of drain regions 63 contacts a respective semiconductor channel (601, 602) within the array of memory stack structures 55. A bottom surface of each drain region 63 can be located above the horizontal plane including the top surface of the epitaxial semiconductor pedestal 110.

The planarization dielectric layer 70 is a dielectric material layer overlying the epitaxial semiconductor pedestal 110 and laterally surrounding the gate electrodes (152, 154) of the field effect transistors. As used herein, a first element "overlies" a second element if a first horizontal plane including the bottommost point of the first element is within, or above, a second horizontal plane including a topmost point of the second element and if there exits an areal overlap between the area of the first element and the area of the second element in a see-through view along a direction perpendicular to the first and second horizontal planes. If a first element overlies a second element, the second element "underlies" the first element. The top surface of the planarization dielectric layer 70 can be coplanar with the top surfaces of the drain regions 63. In one embodiment, a vertical offset distance between the top surface of the epitaxial semiconductor pedestal 110 and the topmost surface of the alternating stack (32, 42) does not exceed the thickness of a gate dielectric 150 of a field effect transistor located on the epitaxial semiconductor pedestal 110. At least one dielectric liner, such as the first and second dielectric liners (160, 162), can contact the active regions 130 of field effect transistors. In one embodiment, the active regions 130 can have top surfaces that are coplanar with top surfaces of the drain regions 63.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench 68 extending through the entire thickness of the alternating stack (32, 42) can be formed. Subsequently, the trench 68 can be filled with an optional dielectric material such as silicon oxide. Excess portions of the dielectric material can be removed from above the top surface of the planarization dielectric layer 70 by a planarization process such as chemical mechanical planarization and/or a recess etch. The top surfaces of the first and second dielectric liners (160, 162) can be employed as a stopping surface during the planarization. The remaining dielectric material in the trench constitutes a dielectric material portion 64.

Optionally, at least one dielectric cap layer (71, 72) can be formed over the planarization dielectric layer 70. In one embodiment, the at least one dielectric cap layer (71, 72) can include a first dielectric cap layer 71 and a second dielectric cap layer 72. In one embodiment, the first and second dielectric cap layers (71, 72) can include dielectric materials such as silicon oxide, a dielectric metal oxide, and/or silicon nitride.

Figure 13:
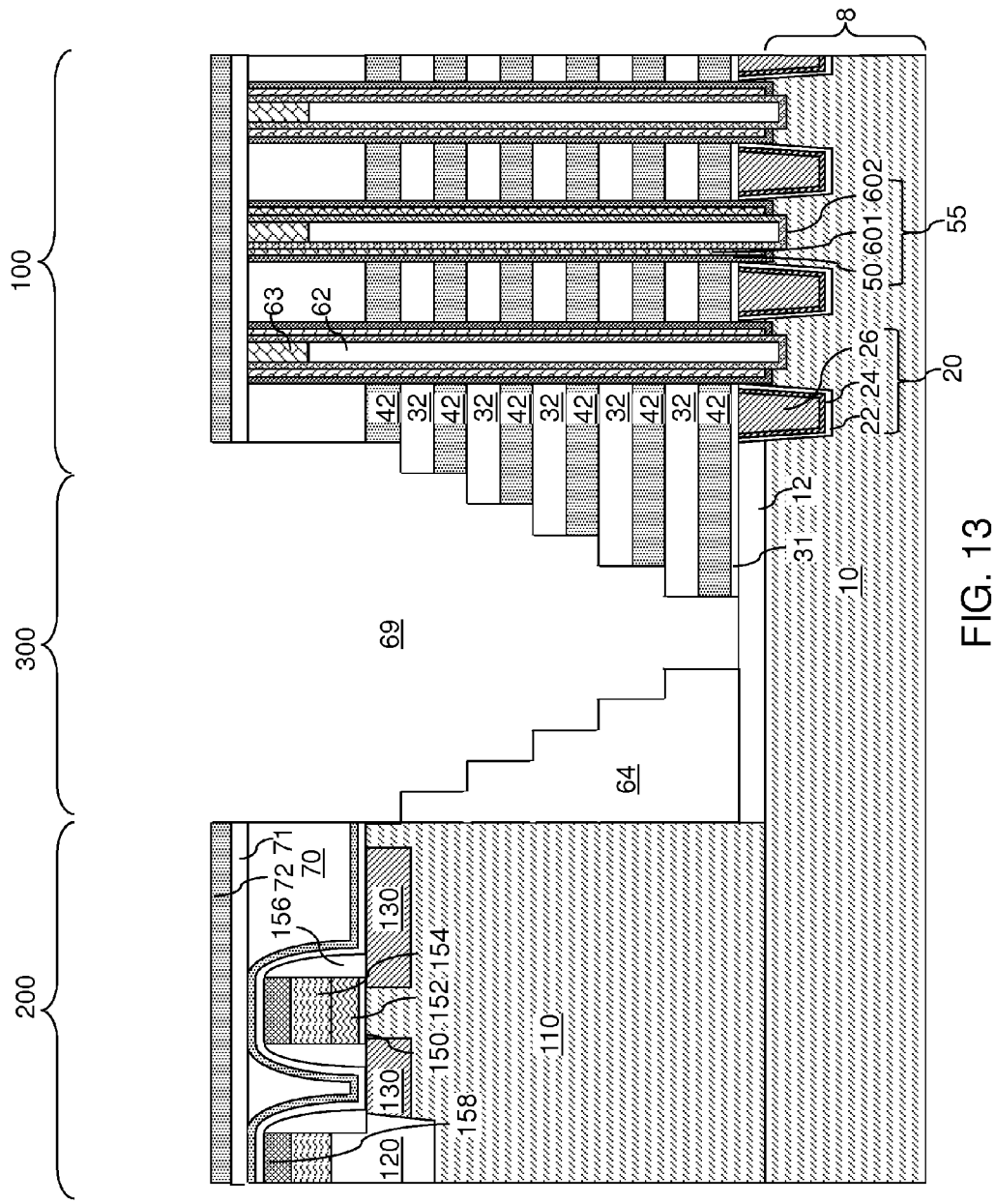
FIG. 13 is a vertical cross-sectional view of the exemplary structure after formation of a set of stepped surfaces according to an embodiment of the present disclosure.

Referring to FIG. 13, a stepped cavity 69 can be formed within a contact region 300, which can straddle the dielectric material portion 64 and a portion of the alternating stack (32, 42). Alternatively, the trench 68 and the dielectric material portion 64 may be omitted and the stepped cavity 69 may be formed directly in the stack (32, 42). The stepped cavity 69 can have various stepped surfaces such that the horizontal cross-sectional shape of the stepped cavity 69 changes in steps as a function of the vertical distance from the top surface of the substrate 8. In one embodiment, the stepped cavity 69 can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity 69, and a peripheral portion of the alternating stack (32, 42) can have stepped surfaces after formation of the stepped cavity 69. Alternatively, the opposite sides of the stack (32, 42) adjacent to portions 100 and 300 may have steps in layers 32 and 42 on both sides of the cavity 69 if the trench 68 and the dielectric material portion 64 are omitted.

As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

Figure 14:
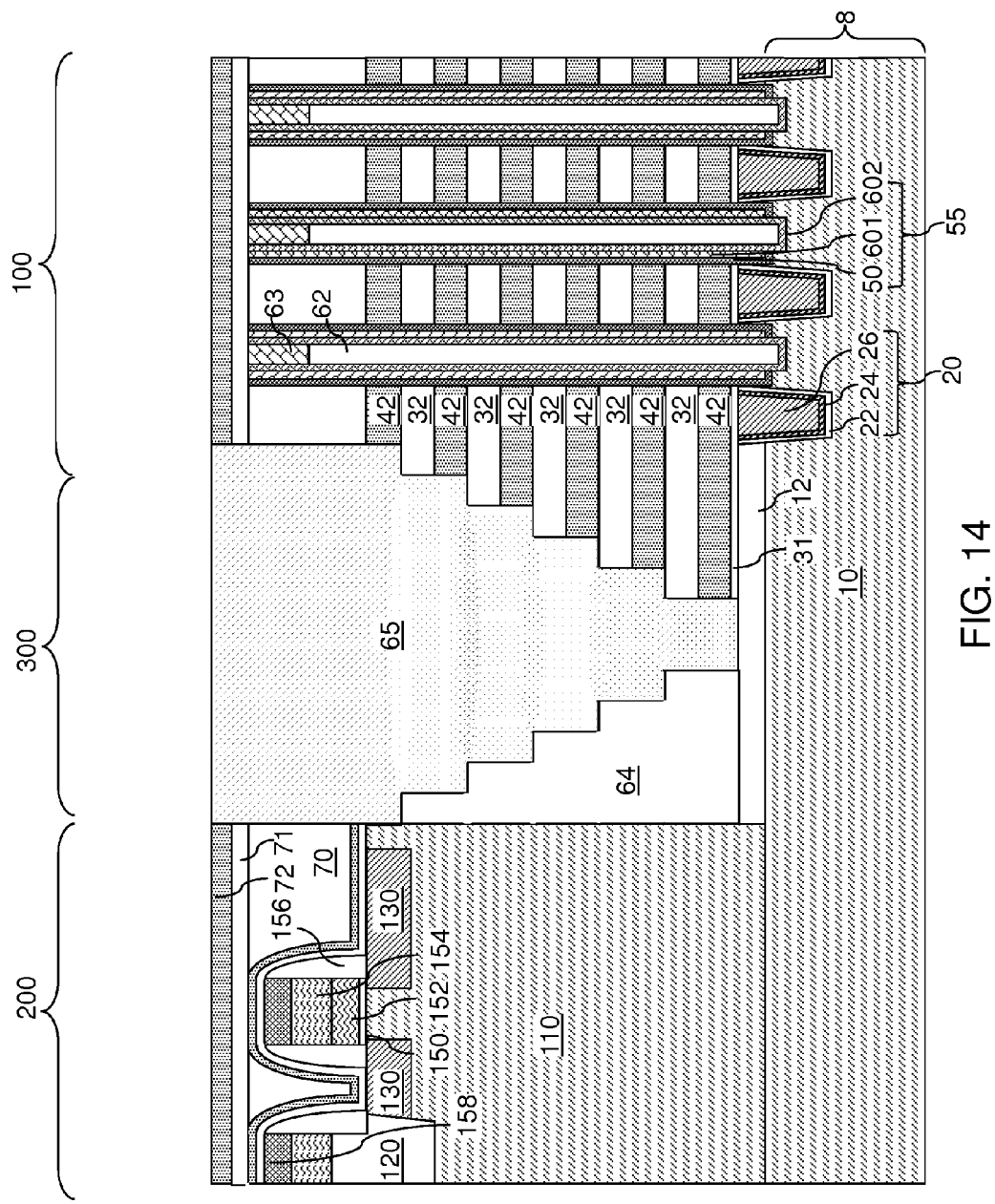
FIG. 14 is a vertical cross-sectional view of the exemplary structure after formation of a dielectric fill material portion according to an embodiment of the present disclosure.

Referring to FIG. 14, a retro-stepped dielectric material portion 65 (i.e., insulating fill) can be formed in the stepped cavity 69 by deposition of a dielectric material therein. A dielectric material such as silicon oxide can be deposited in the stepped cavity 69. Excess portions of the deposited dielectric material can be removed from above the top surface of the at least one dielectric cap layer (71, 72), for example, by chemical mechanical planarization (CMP). The remaining portion of the deposited dielectric material filling the stepped cavity 69 constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 15:
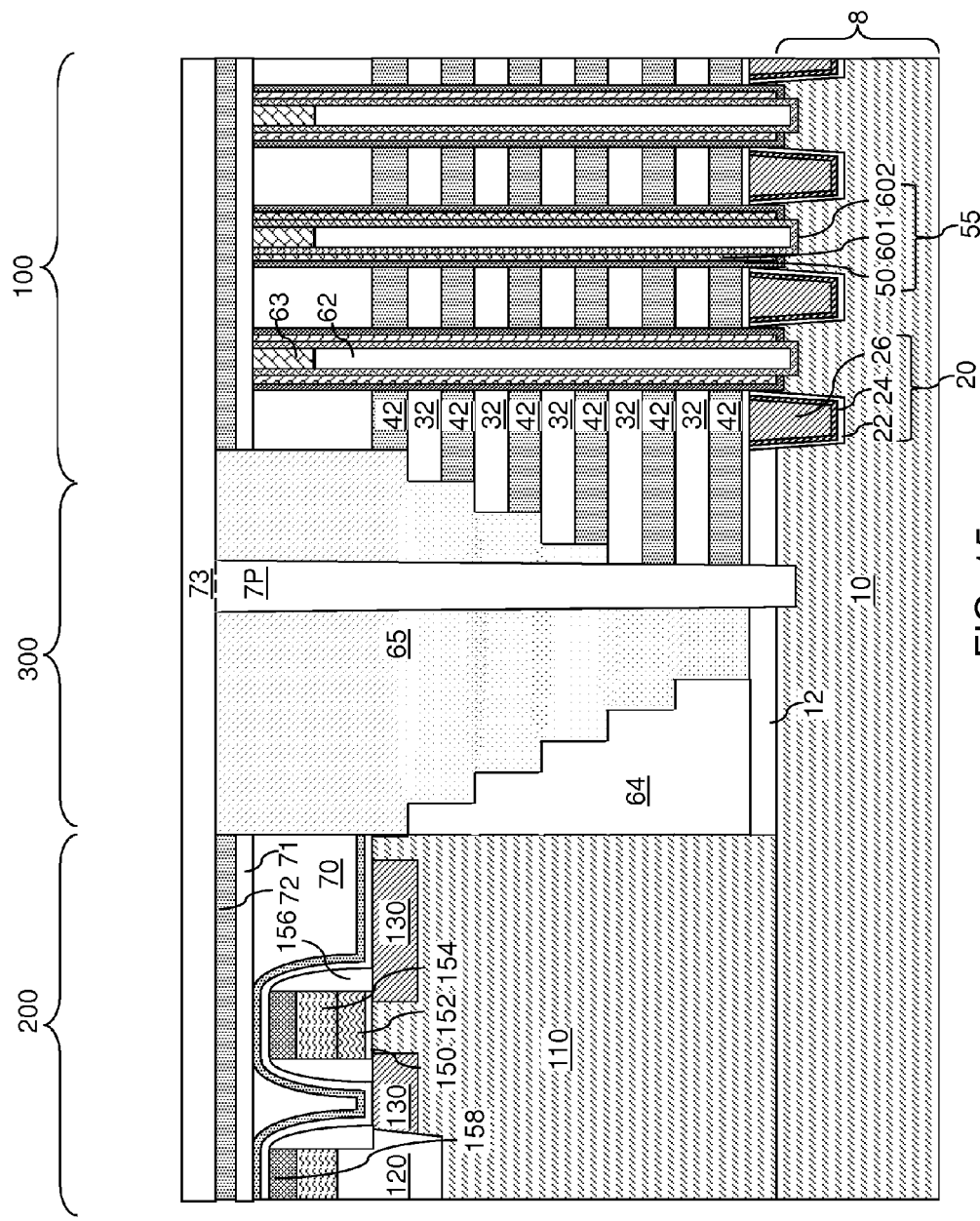
FIG. 15 is a vertical cross-sectional view of the exemplary structure after formation of an optional dielectric support pillar structure according to an embodiment of the present disclosure.

Referring to FIG. 15, at least one dielectric support pillar 7P may be optionally formed through the retro-stepped dielectric material portion 65 and/or through the alternating stack (32, 42). The at least one dielectric support pillar 7P can be formed, for example, by forming an opening extending through the retro-stepped dielectric material portion 65 and/or through the alternating stack (32, 42) and at least to the top surface of the substrate 8, and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer (71, 72) concurrently with deposition of the at least one dielectric support pillar 7P can be present over the at least one dielectric cap layer (71, 72) as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer (71, 72) concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer (71, 72) can be physically exposed.

Figure 16A:
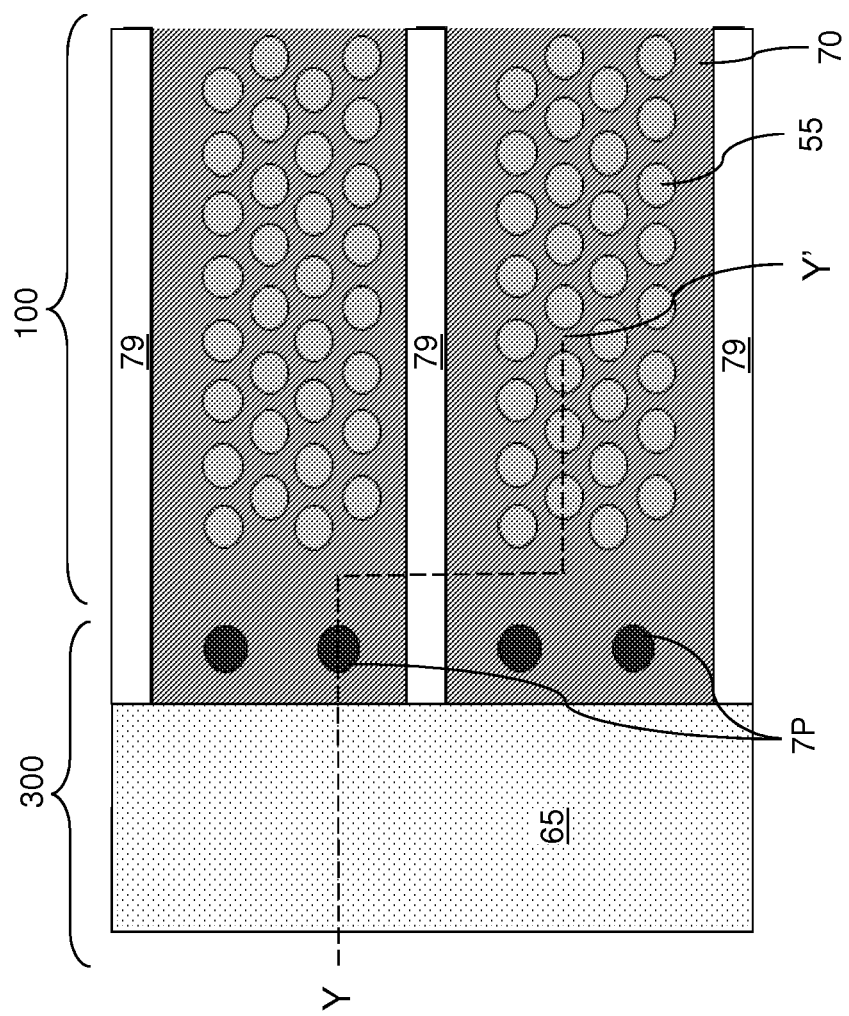
FIG. 16A is a top-down view of the exemplary structure after formation of a source contact trench according to an embodiment of the present disclosure.
Figure 16B:
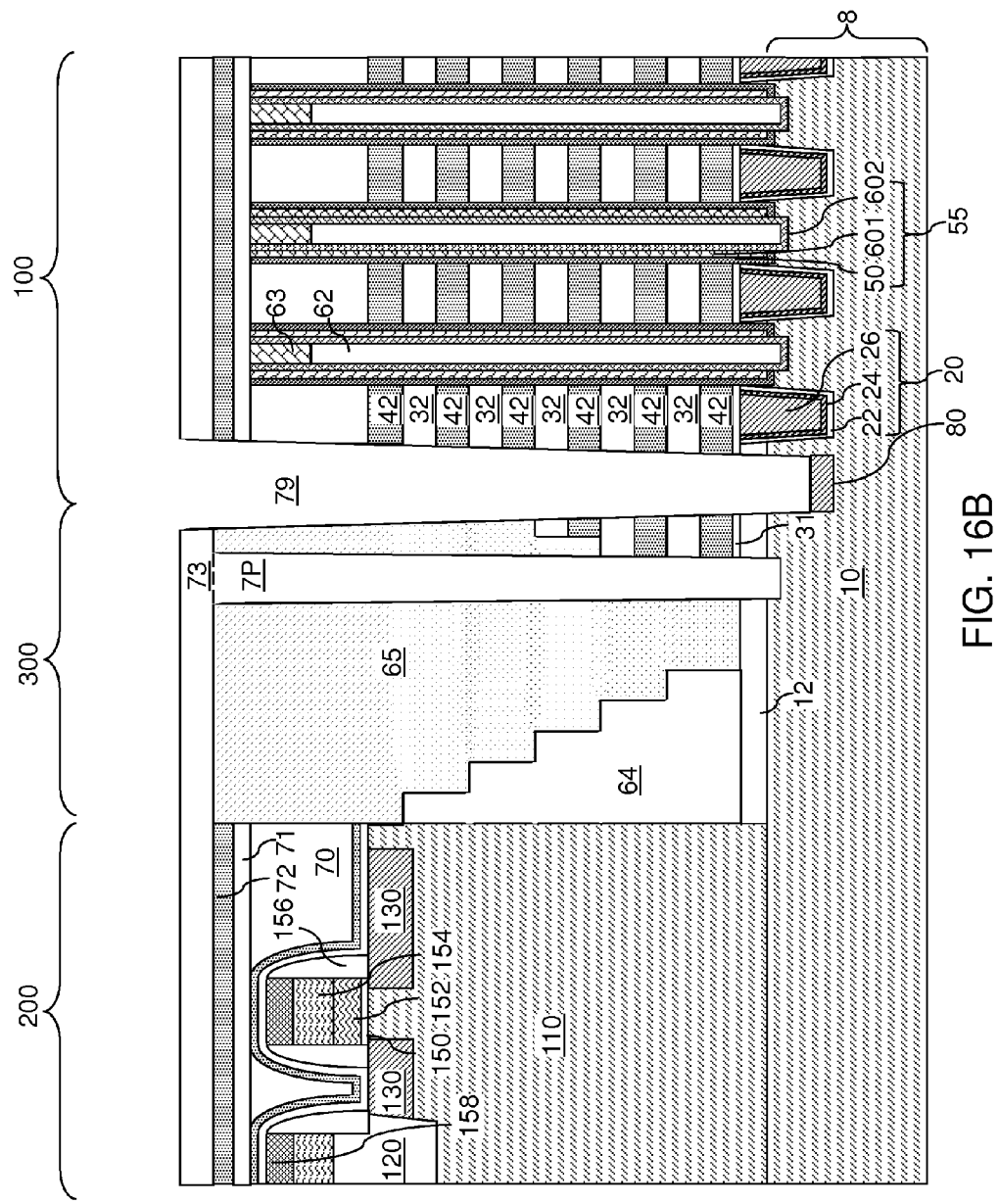
FIG. 16B is a zig-zag vertical cross-sectional view along the zig-zag plane Y-Y' of FIG. 16A

FIG. 16A is a top-down view of the exemplary structure of FIG. 16B. FIG. 16B is a zig-zag vertical cross-sectional view along line Y-Y' in FIG. 16A of the exemplary structure after formation of a backside contact trench according to an embodiment of the present disclosure. FIGS. 17-24 are zig-zag vertical cross-sectional view along line Y-Y' during subsequent processing steps.

Referring to FIGS. 16A and 16B, a photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate 8. In one embodiment, the at least one backside contact trench 79 can include a source contact opening in which a source contact via structure can be subsequently formed. If desired, a source region 80 may be formed by implantation of dopant atoms into a portion of the substrate semiconductor layer 10 through the backside contact trench 79.

Figure 17:
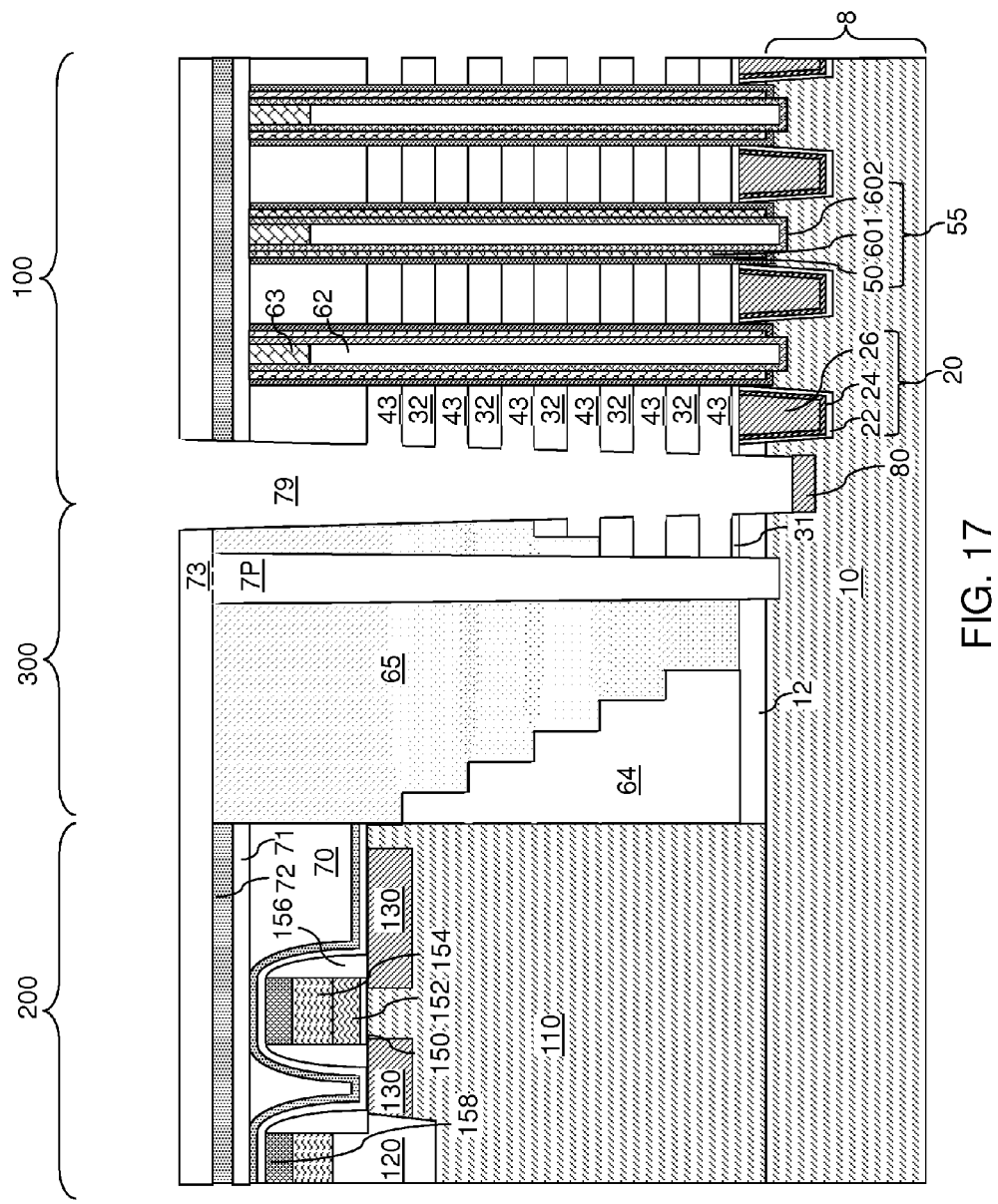
FIG. 17 is a zig-zag vertical cross-sectional view of the exemplary structure after formation of backside recesses according to an embodiment of the present disclosure.

Referring to FIG. 17, an etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the substrate semiconductor layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three dimensional NAND strings having a plurality of device levels disposed above the substrate 8. In this case, each backside recess 43 can define a space for receiving a respective word line of the array of monolithic three dimensional NAND strings.

Each of the plurality of backside recesses 43 can extend substantially parallel to the top surface of the substrate 8. A backside recess 43 can be vertically bounded by a top surface of an underlying insulator layer 32 and a bottom surface of an overlying insulator layer 32. In one embodiment, each backside recess 43 can have a uniform height throughout.

Figure 18:
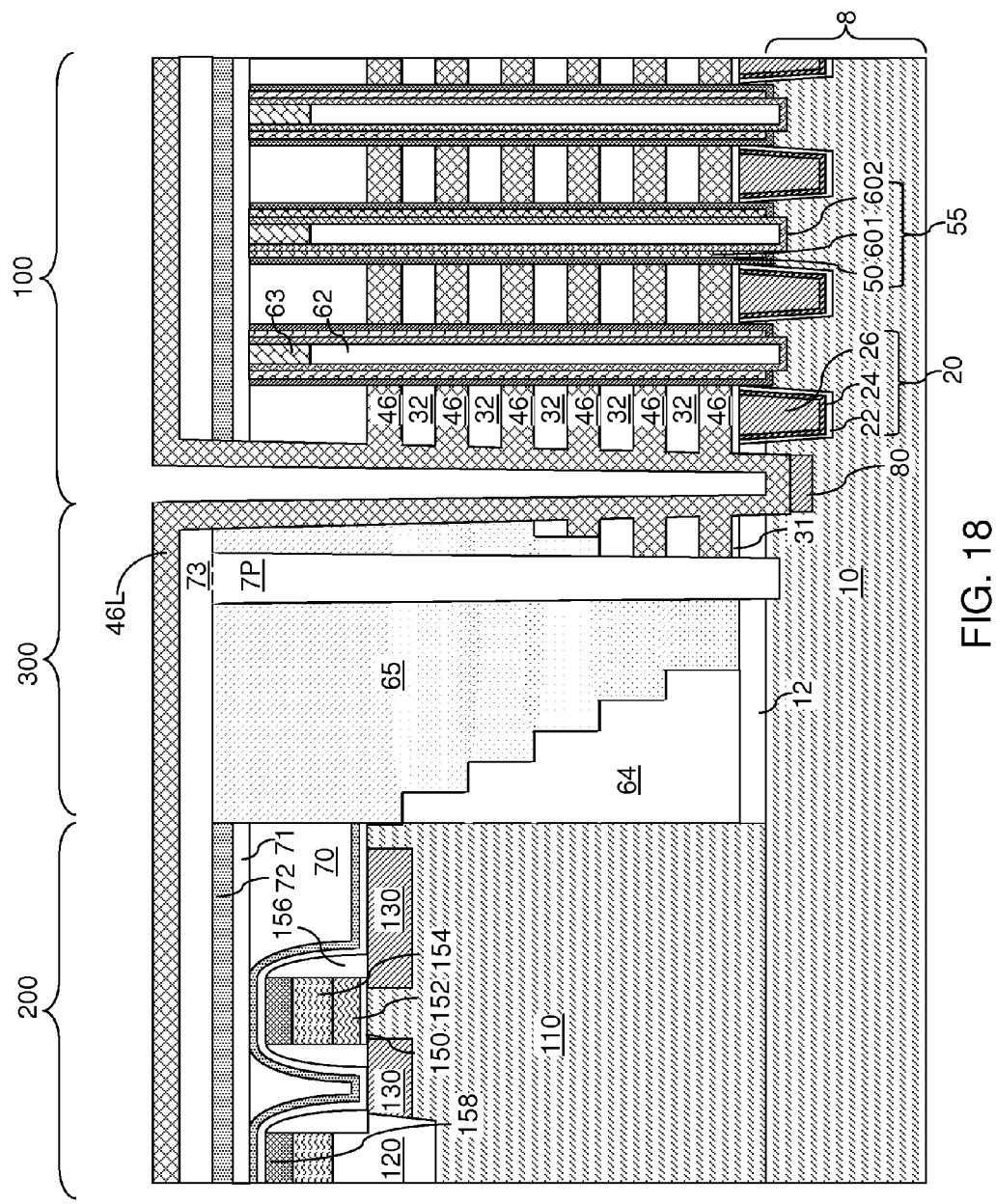
FIG. 18 is a zig-zag vertical cross-sectional view of the exemplary structure after formation of electrically conductive layers according to an embodiment of the present disclosure.

Referring to FIG. 18, a conductive material can be deposited in the plurality of backside recesses 43, on sidewalls of the at least one the backside contact trench 79, and over the top surface of the dielectric pillar material layer 73 (or the topmost layer of the exemplary structure in case the dielectric pillar material layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition.

A plurality of electrically conductive layers 46 is present in the plurality of backside recesses 43, and an electrically conductive layer 46L can be formed on the sidewalls of each backside contact trench 79 and over the dielectric pillar material layer 73 (or the topmost layer of the exemplary structure in case the dielectric pillar material layer 73 is not employed). Thus, at least a portion of each sacrificial material layer 42 can be replaced with an electrically conductive layer 46, which is a conductive material portion.

Figure 19:
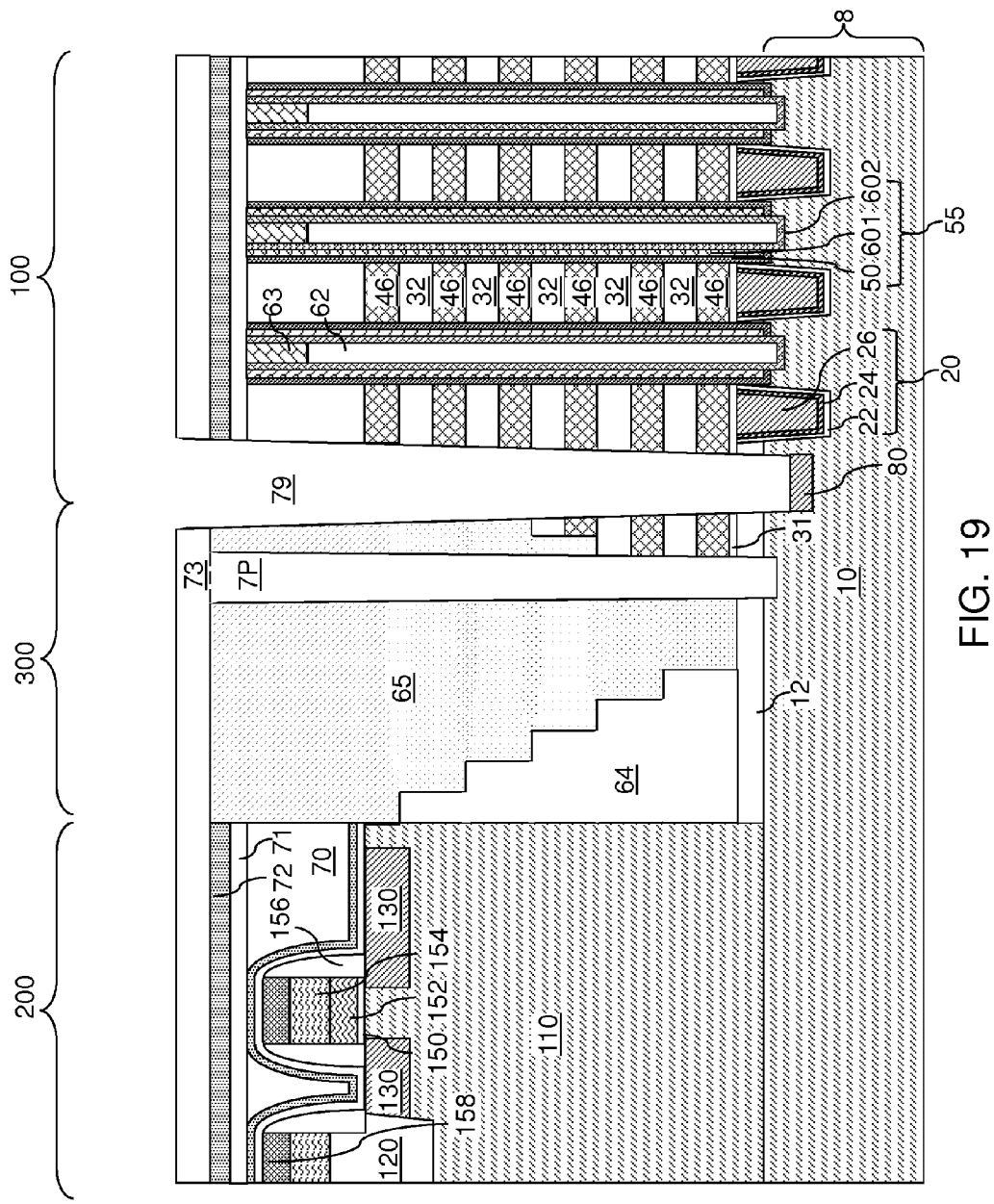
FIG. 19 is a zig-zag vertical cross-sectional view of the exemplary structure after removal of a conductive material from within a source trench according to an embodiment of the present disclosure.

Referring to FIG. 19, the deposited conductive material is etched back from the sidewalls of each backside contact trench 79 and from above the dielectric pillar material layer 73 (or the topmost layer of the exemplary structure in case the dielectric pillar material layer 73 is not employed), for example, by an isotropic etch. Each remaining portion of the deposited conductive material in the backside recesses 43 constitutes an electrically conductive layer 46. Each electrically conductive layer 46 can be a conductive line structure. Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Figure 20:
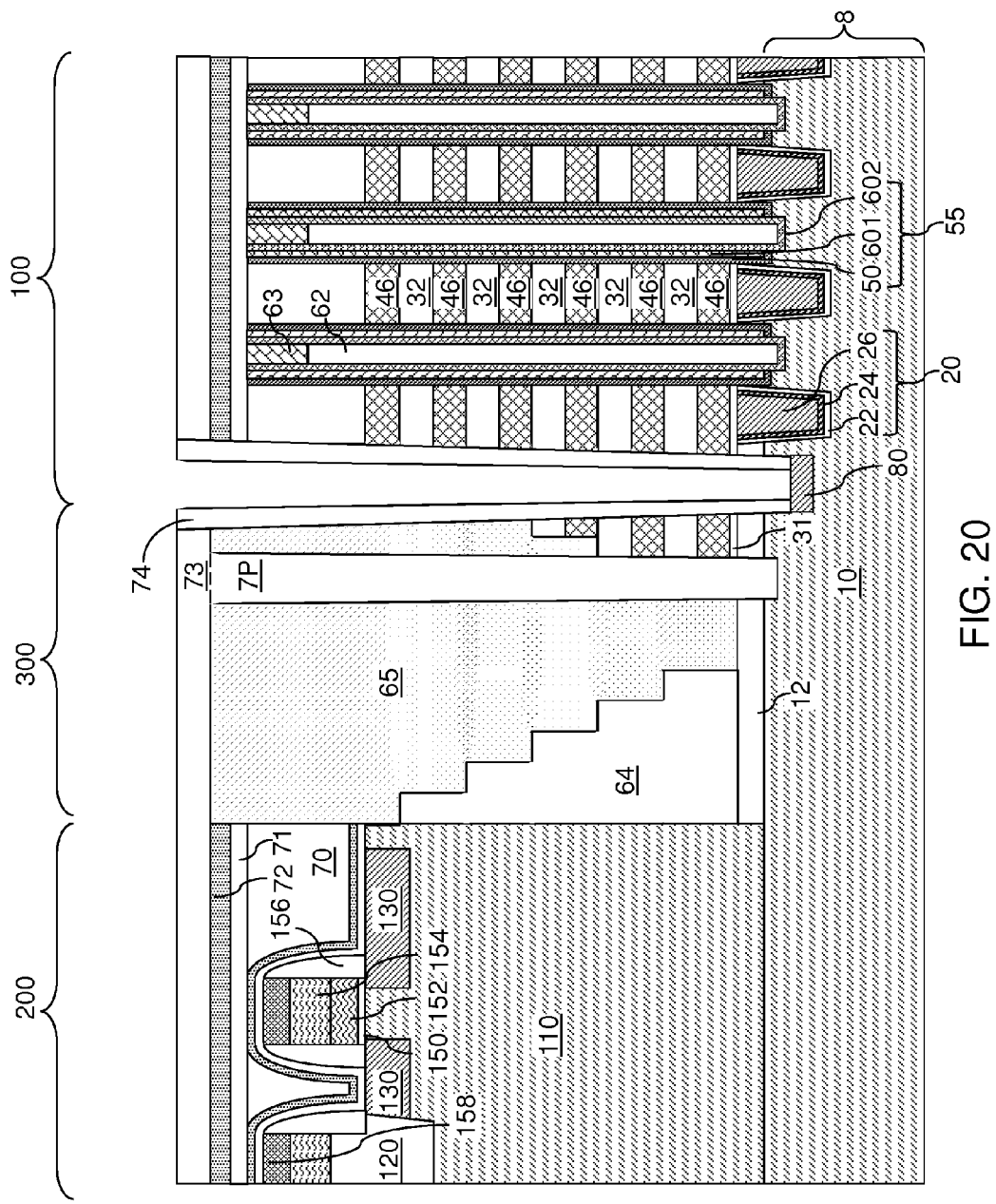
FIG. 20 is a zig-zag vertical cross-sectional view of the exemplary structure after formation of a dielectric spacer within the source trench according to an embodiment of the present disclosure.

Referring to FIG. 20, an insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

Figure 21:
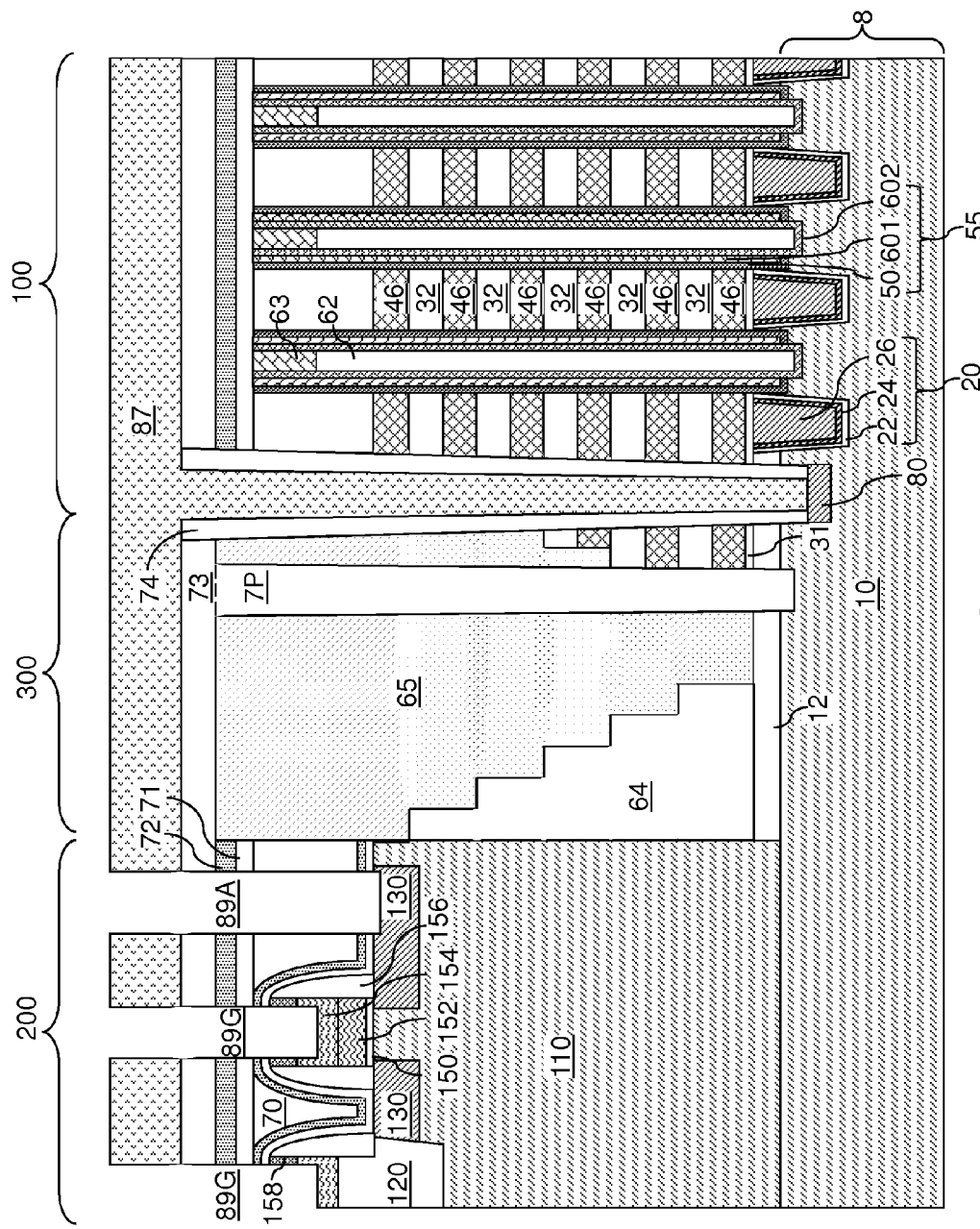
FIG. 21 is a zig-zag vertical cross-sectional view of the exemplary structure after formation of contact via cavities in a peripheral device region according to an embodiment of the present disclosure.

Referring to FIG. 21, a photoresist layer 87 can be applied over the topmost layer of the exemplary structure (which can be, for example, the dielectric pillar material layer 73) and in the cavity laterally surrounded by the insulating spacer 74, and is lithographically patterned to form various openings in the peripheral device region 200. The locations and the shapes of the various openings are selected to correspond to electrical nodes of the semiconductor devices to be electrically contacted by contact via structures. An anisotropic etch is performed to etch through the various layers overlying the electrical nodes of the semiconductor devices. For example, at least one gate via cavity 89G can be formed such that the bottom surface of each gate via cavity 89G is a surface of a gate electrode (152, 154), and at least one active region via cavity 89A can be formed such that the bottom surface of each active region via cavity 89A is a surface of an active region 130. In one embodiment, different types of via cavities (89G, 89A) can be formed separately employing multiple combinations of photoresist layers and anisotropic etch processes. The vertical extent of each gate via cavity 89G, as measured from the top surface of the dielectric pillar material layer 73 to the bottom surface of the gate via cavity 89G, can be less than the vertical distance between the top surface of the dielectric pillar material layer 73 and the topmost surface of the alternating plurality (32, 46) of the insulator layers 32 and the electrically conductive layers 46.

Figure 22:
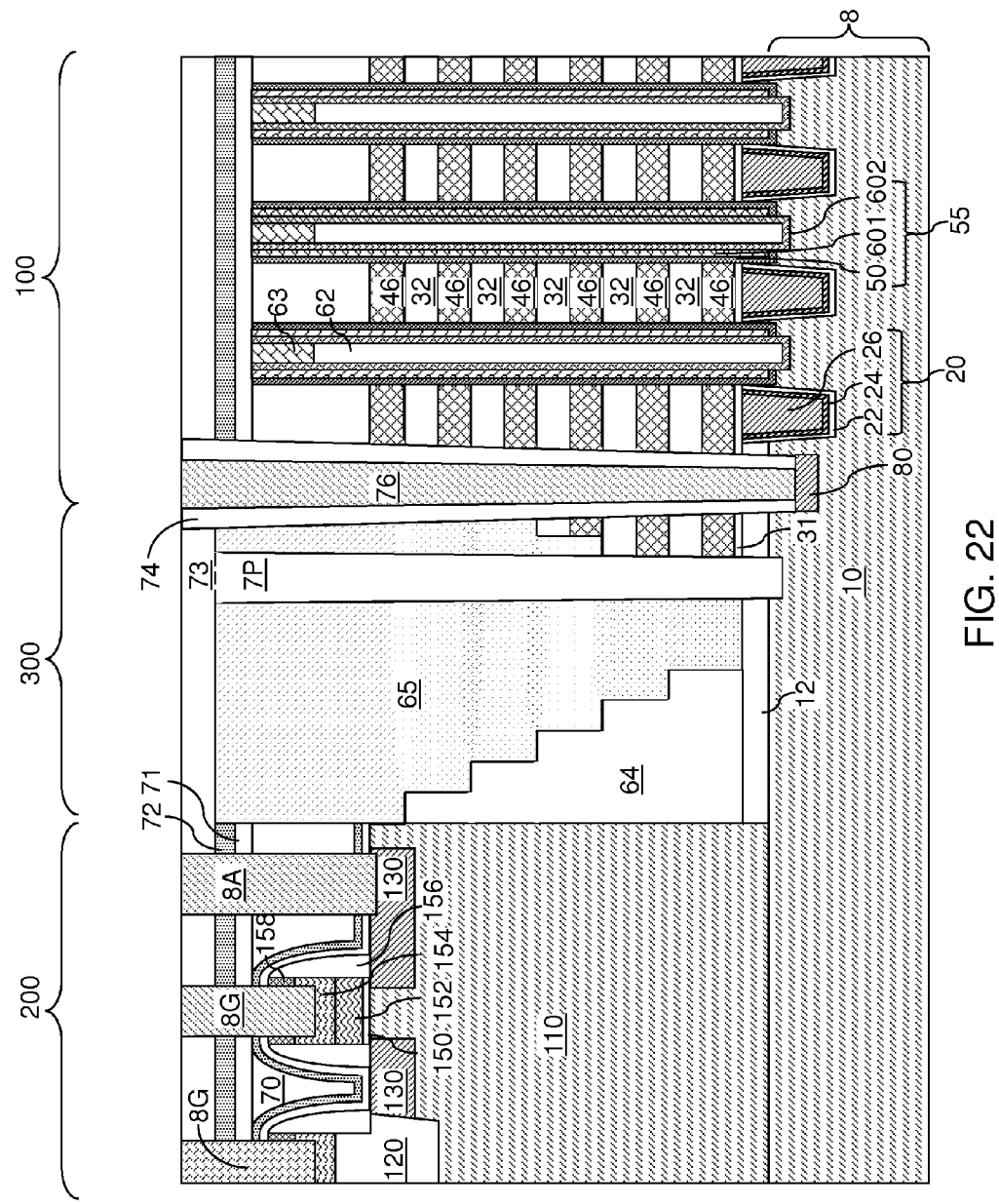
FIG. 22 is a zig-zag vertical cross-sectional view of the exemplary structure after formation of a source contact via structure according to an embodiment of the present disclosure.

Referring to FIG. 22, the cavity laterally surrounded by the insulating spacer 74 and the various via cavities (89G, 89A) in the peripheral device region 200 are filled with a conductive material to form various contact via structures. For example, a backside contact via structure 76 can be formed in the cavity surrounded by the insulating spacer 74, a gate contact via structure 8G is formed in each gate via cavity 89G, and an active region via structure 8A is formed in each active region via cavity 89A.

Figure 23:
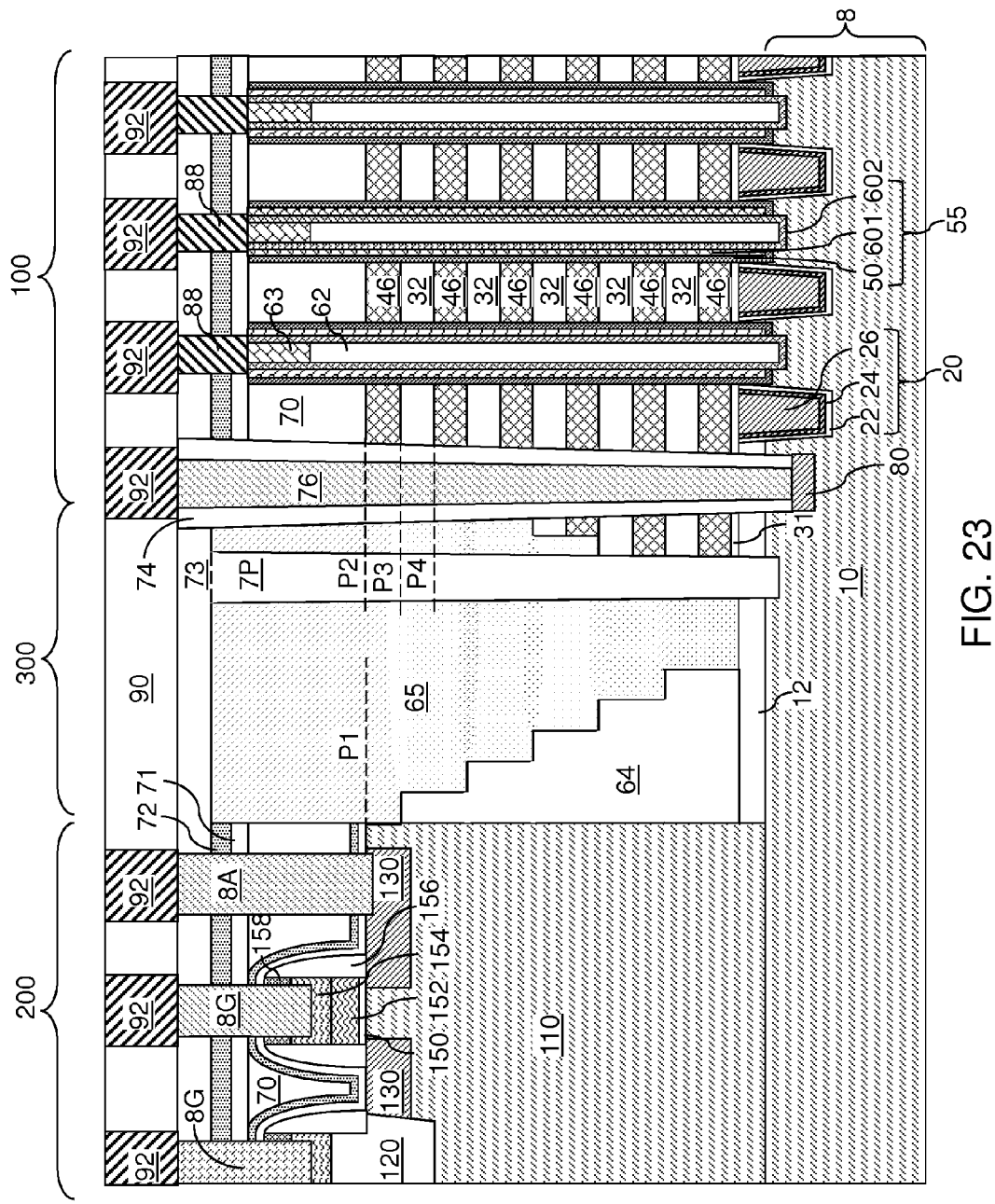
FIG. 23 is a zig-zag vertical cross-sectional view of the exemplary structure after formation of conductive line structures according to an embodiment of the present disclosure.

Referring to FIG. 23, drain contact via structures 88 can be formed to provide electrical contact to the drain regions 63. Subsequently, a line-level dielectric layer 90 can be formed over the dielectric pillar material layer 73, and various conductive line structures 92 can be formed in the line-level dielectric layer 90 to provide electrical contact to the various contact via structures (76, 8G, 8A, 88). A plurality of electrically conductive contact via structures (not shown) can be formed in the contact region 300 to provide electrical contact to each of the electrically conductive layers 46. A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

The exemplary structure is a multilevel structure including a stack (32, 46) of an alternating plurality of electrically conductive layers 46 and insulator layers 32 located over a semiconductor substrate including the substrate semiconductor layer 10. An array of memory stack structures 55 can be located within memory openings through the stack. The epitaxial semiconductor pedestal 110 is in epitaxial alignment with a single crystalline substrate semiconductor material in the semiconductor substrate, and has a top surface within a horizontal plane located above a plurality of electrically conductive layers 46 within the stack (32, 46).

The top surface of the epitaxial semiconductor pedestal 110 is located with a first horizontal plane P1. The top surface of the alternating stack (32, 46) is located within a second horizontal plane P2. If the gate dielectric layer, from which the gate dielectric 150 is derived, is formed by deposition of a dielectric material, the first horizontal plane P1 can be coplanar with the second horizontal plane P2 including the topmost surface of the stack (32, 46). If the gate dielectric layer, from which the gate dielectric 150 is derived, is formed by conversion (e.g., oxidation) of a surface portion of the epitaxial semiconductor pedestal 110, the vertical offset between the first horizontal plane P1 and the second horizontal plane P2 can be less than the thickness of the gate dielectric 150. In one embodiment, the top surface of the epitaxial semiconductor pedestal 110 can be located above a third horizontal plane P3 including the bottom surface of a topmost electrically conductive layer 46 within the stack (32, 46). In another embodiment, the top surface of the epitaxial semiconductor pedestal 110 can be located above a fourth horizontal plane P4 including the bottom surface of a topmost insulator layer 32 within the stack (32, 46).

At least one dielectric material layer (71, 72, 73) overlies the stack (32, 46) and the at least one semiconductor device. At least one contact via structure (8G, 88) extends through the at least one dielectric material layer (71, 72, 73). A bottommost surface of the at least one contact via structure (8G, 88) is located above the third horizontal plane P3, and above the fourth horizontal plane P4.

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate 8. The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 200 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An epitaxial semiconductor pedestal 110 is in epitaxial alignment with a single crystalline substrate semiconductor material in the semiconductor substrate, and has a top surface within the first horizontal plane p1 located above a plurality of electrically conductive layers 46 within the stack (32, 46). An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten or a combination of titanium nitride and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region 80. The source region 80 can be in contact with the horizontal portion of the semiconductor channel in an upper portion of the substrate semiconductor layer 10. A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element.

In a non-limiting illustrative example, the three-dimensional NAND device can further include field effect transistors located on the top surface of the epitaxial semiconductor pedestal 110. Gate electrodes (152, 154) of the field effect transistors protrude above the second horizontal plane P2 including the topmost surface of the stack (32, 46). An array of drain regions 63 contacts a respective semiconductor channel (601, 602) within the array of memory stack structures 55. A dielectric material layer, such as the planarization dielectric layer 70, overlies the epitaxial semiconductor pedestal 110, and laterally surrounds the gate electrode (152, 154) of the field effect transistors. A top surface of the dielectric material layer, i.e., the planarization dielectric layer 70, can be coplanar with top surfaces of the drain regions 63.

In a non-limiting illustrative example, the top surface of the epitaxial semiconductor pedestal 110 can be located above the third horizontal plane P3 including the bottom surface of a topmost electrically conductive layer 46 within the stack (32, 46), and the top surface of the epitaxial semiconductor pedestal 110 can be located above the fourth horizontal plane P4 including the bottom surface of the topmost insulator layer 32 within the stack (32, 46).

Figure 24:
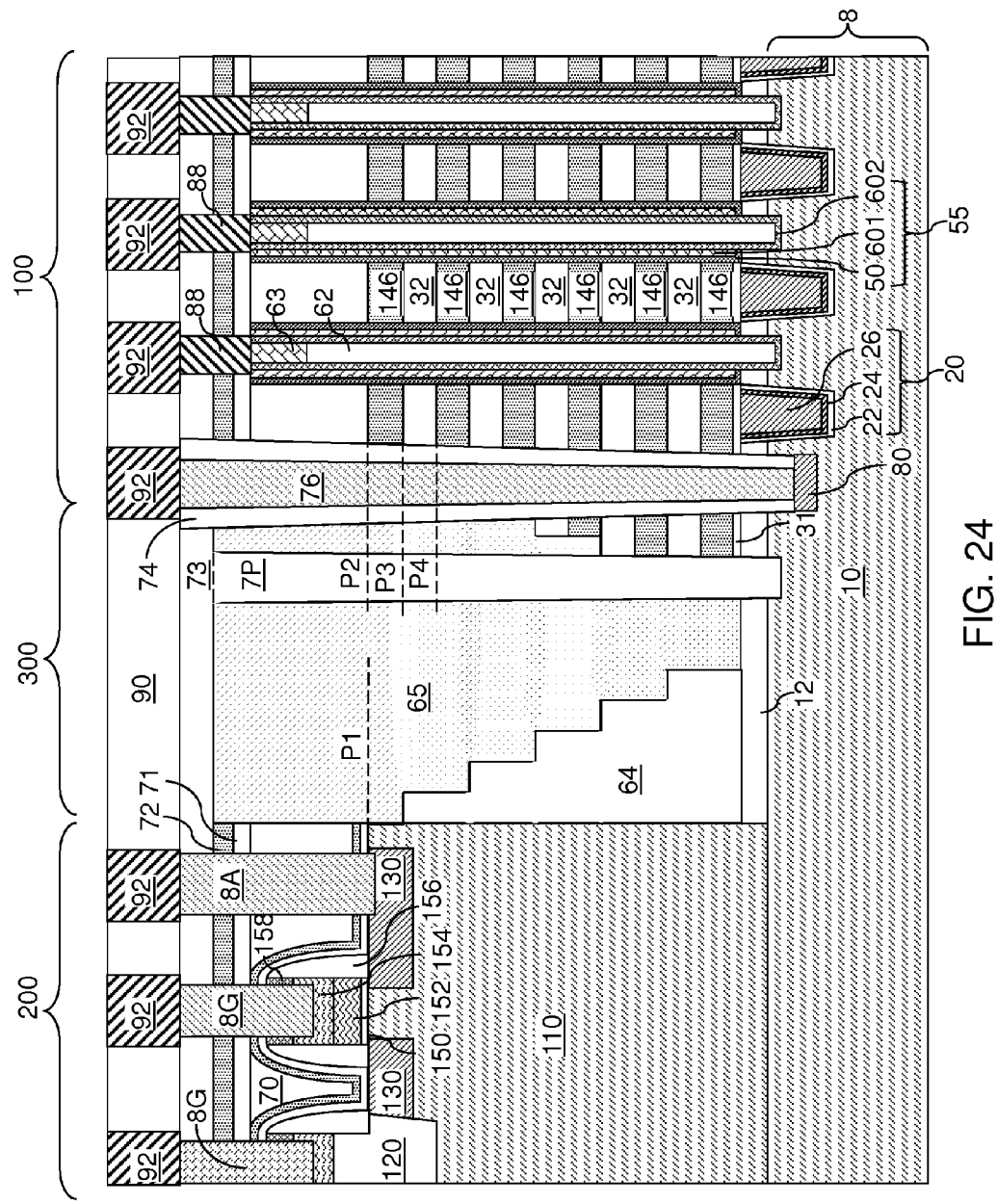
FIG. 24 is a zig-zag vertical cross-sectional view of an alternative embodiment of the exemplary structure according to an embodiment of the present disclosure.

Referring to FIG. 24, an alternative embodiment of the exemplary structure is illustrated, which can be derived by altering the height of the bottom surfaces of the memory films 50 by adjusting the recess depth during formation of the memory openings 49 to the top of the dielectric pad layer 12 during the processing steps of FIG. 10.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A multilevel structure, comprising:
    a stack of an alternating plurality of electrically conductive layers and insulator layers located over a semiconductor substrate;
    an array of memory stack structures located within memory openings through the stack; and
    an epitaxial semiconductor pedestal in epitaxial alignment with a single crystalline substrate semiconductor material in the semiconductor substrate and having a top surface within a horizontal plane located above a plurality of electrically conductive layers within the stack.

2. The multilevel structure of claim 1, further comprising at least one semiconductor device located on the top surface of the epitaxial semiconductor pedestal.

3. The multilevel structure of claim 2, wherein the at least one semiconductor device comprises a field effect transistor, and a gate electrode of the field effect transistor protrudes above another horizontal plane including a topmost surface of the stack.

4. The multilevel structure of claim 3, comprising an array of drain regions contacting a respective semiconductor channel within the array of memory stack structures.

5. The multilevel structure of claim 4, further comprising at least one dielectric liner contacting an active region of the field effect transistor and having a top surface that is coplanar with top surfaces of the drain regions.

6. The multilevel structure of claim 4, wherein a bottom surface of each drain region is located above the horizontal plane including the top surface of the epitaxial semiconductor pedestal.

7. The multilevel structure of claim 4, further comprising a dielectric material layer overlying the epitaxial semiconductor pedestal and laterally surrounding the gate electrode of the field effect transistor, wherein a top surface of the dielectric material layer is coplanar with top surfaces of the drain regions.

8. The multilevel structure of claim 3, wherein a vertical offset distance between the top surface of the epitaxial semiconductor pedestal and a topmost surface of the stack does not exceed a thickness of a gate dielectric of the field effect transistor.

9. The multilevel structure of claim 2, further comprising:
    at least one dielectric material layer overlying the stack and the at least one semiconductor device; and
    at least one contact via structure extending through the at least one dielectric material layer, wherein a bottommost surface of the at least one contact via structure is located above a horizontal plane including a bottom surface of a topmost electrically conductive layer within the stack.

10. The multilevel structure of claim 1, wherein the top surface of the epitaxial semiconductor pedestal is located above another horizontal plane including a bottom surface of a topmost electrically conductive layer within the stack.

11. The multilevel structure of claim 1, wherein the top surface of the epitaxial semiconductor pedestal is located above another horizontal plane including a bottom surface of a topmost insulator layer within the stack.

12. The multilevel structure of claim 1, further comprising a stepped dielectric material portion in contact with a sidewall of the epitaxial semiconductor pedestal and overlying the substrate.

13. The multilevel structure of claim 1, wherein the top surface of the epitaxial semiconductor pedestal is coplanar with a topmost surface of the stack.

14. The multilevel structure of claim 1, further comprising a device located on the semiconductor substrate, wherein:
    the device comprises a vertical NAND device located in a device region; and
    at least one of the electrically conductive layers in the stack comprises, or is electrically connected to, a word line of the NAND device.

15. The multilevel structure of claim 14, wherein:
    the device region comprises:
        a plurality of semiconductor channels, wherein at least one end portion of each of the plurality of semiconductor channels extends substantially perpendicular to a top surface of the semiconductor substrate;
        a plurality of charge storage regions, each charge storage region located adjacent to a respective one of the plurality of semiconductor channels; and
        a plurality of control gate electrodes having a strip shape extending substantially parallel to the top surface of the substrate;
    the plurality of control gate electrodes comprise at least a first control gate electrode located in the first device level and a second control gate electrode located in the second device level; and
    a plurality of electrically conductive layers in the stack is in electrical contact with the plurality of control gate electrodes and extends from the device region to a contact region including the plurality of electrically conductive contact via structures.

16. A method of fabricating a multilevel structure, comprising:
    forming a stack including an alternating plurality of material layers and insulator layers over a semiconductor substrate;
    forming an opening through the stack, wherein a top surface of the semiconductor substrate is exposed at a bottom of the opening;
    forming, within the opening, an epitaxial semiconductor pedestal in epitaxial alignment with a single crystalline substrate semiconductor material in the semiconductor substrate;
    forming an array of memory openings through the stack after formation of the epitaxial semiconductor pedestal; and
    forming an array of memory stack structures within the array of memory openings.

17. The method of claim 16, wherein the epitaxial semiconductor pedestal is formed by:
    depositing, within the opening, a single crystalline semiconductor material in epitaxial alignment with the single crystalline substrate semiconductor material within the substrate; and recessing a top surface of the deposited single crystalline semiconductor material to a height that is not lower than a topmost surface of the stack.

18. The method of claim 17, wherein the recessing of the top surface of the deposited single crystalline semiconductor material is performed by chemical mechanical planarization.

19. The method of claim 17, wherein the topmost surface of the stack is employed as a stopping layer during planarization of the top surface of the deposited single crystalline semiconductor material.

20. The method of claim 17, wherein the material layers comprises silicon nitride or a semiconductor material including at least one of silicon and germanium.

21. The method of claim 16, further comprising forming at least one semiconductor device on a top surface of the epitaxial semiconductor pedestal.

22. The method of claim 21, wherein the at least one semiconductor device comprises a field effect transistor.

23. The method of claim 16, wherein a top surface of the epitaxial semiconductor pedestal is formed above a horizontal plane including a bottom surface of a topmost electrically conductive layer within the stack.

24. The method of claim 16, wherein a top surface of the epitaxial semiconductor pedestal is formed above another horizontal plane including a bottom surface of a topmost insulator layer within the stack.

25. The method of claim 16, wherein each of the memory stack structures comprises:
a memory film including a charge trapping layer; and
a semiconductor channel including a portion that extends vertically from a top surface of the semiconductor substrate.

26. The method of claim 16, further comprising replacing a portion of each material layer with a conductive material portion after formation of the array of memory stack structures.

27. The method of claim 16, further comprising forming a device on the substrate, wherein:
the device comprises a vertical NAND device located in a device region; and
at least one of the electrically conductive layers in the stack comprises, or is electrically connected to, a word line of the NAND device.

28. The method of claim 27, wherein:
the device region comprises:
a plurality of semiconductor channels, wherein at least one end portion of each of the plurality of semiconductor channels extends substantially perpendicular to a top surface of the substrate; and
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in the first device level and a second control gate electrode located in the second device level; and
a plurality of electrically conductive layers in the stack is in electrical contact with the plurality of control gate electrodes and extends from the device region to a contact region including the plurality of electrically conductive contact via structures.

29. A three-dimensional NAND device, comprising:
a stack of an alternating plurality of word lines and insulating layers located over a semiconductor substrate, each of the word lines and insulating layers being located at different levels that are vertically spaced from a top surface of the semiconductor substrate by different distances;
an epitaxial semiconductor pedestal in epitaxial alignment with a single crystalline substrate semiconductor material in the semiconductor substrate and having a top surface within a horizontal plane located above a plurality of electrically conductive layers within the stack; and
an array of memory stack structures embedded within the stack,
wherein each memory stack structure comprises:
a semiconductor channel, at least one end portion of the semiconductor channel extending substantially perpendicular to the top surface of the semiconductor substrate through the stack; and
at least one charge storage region located adjacent to the semiconductor channel.

30. The three-dimensional NAND device of claim 29, wherein:
the insulating layers comprise silicon oxide layers;
the plurality of word lines comprise tungsten or a combination of titanium nitride and tungsten;
the at least one charge storage region comprises a tunneling dielectric, a blocking dielectric layer, and either a plurality of floating gates or a charge trapping layer located between the tunneling dielectric layer and the blocking dielectric layer;
an end portion of each of the plurality of word lines in a device region comprises a control gate electrode located adjacent to the at least one charge storage region;
a plurality of contact via structures are located in a contact region;
the plurality of word lines extends from the device region to the contact region;
a source line extends through a dielectric insulated trench in the stack to electrically contact the semiconductor channel; and
a drain line electrically contacts an upper portion of the semiconductor channel.

31. The three-dimensional NAND device of claim 29, further comprising:
a field effect transistor located on the top surface of the epitaxial semiconductor pedestal, wherein a gate electrode of the field effect transistor protrudes above another horizontal plane including a topmost surface of the stack;
an array of drain regions contacting a respective semiconductor channel within the array of memory stack structures; and
a dielectric material layer overlying the epitaxial semiconductor pedestal and laterally surrounding the gate electrode of the field effect transistor, wherein a top surface of the dielectric material layer is coplanar with top surfaces of the drain regions.

32. The three-dimensional NAND device of claim 29, wherein:
a top surface of the epitaxial semiconductor pedestal is located above another horizontal plane including a bottom surface of a topmost electrically conductive layer within the stack; and
the top surface of the epitaxial semiconductor pedestal is located above another horizontal plane including a bottom surface of a topmost insulator layer within the stack.

* * * * *